United States Patent
Chen et al.

(10) Patent No.: US 10,332,823 B2
(45) Date of Patent: Jun. 25, 2019

(54) PACKAGED SEMICONDUCTOR DEVICES

(71) Applicant: Taiwan Semiconductor Manufacturing Company, Ltd., Hsinchu (TW)

(72) Inventors: Kim Hong Chen, Fremont, CA (US);
Szu-Po Huang, Taichung (TW);
Shin-Puu Jeng, Hsinchu (TW);
Wensen Hung, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/222,754

(22) Filed: Dec. 17, 2018

(65) Prior Publication Data

US 2019/0122959 A1    Apr. 25, 2019

Related U.S. Application Data

(60) Continuation of application No. 14/981,001, filed on Dec. 28, 2015, now Pat. No. 10,157,818, which is a division of application No. 13/791,077, filed on Mar. 8, 2013, now Pat. No. 9,224,673.

(51) Int. Cl.
*H01L 23/473* (2006.01)
*H01L 33/64* (2010.01)
*H01L 23/44* (2006.01)

(52) U.S. Cl.
CPC ............ *H01L 23/473* (2013.01); *H01L 23/44* (2013.01); *H01L 33/648* (2013.01); *H01L 2224/73253* (2013.01); *Y10T 29/49117* (2015.01)

(58) Field of Classification Search
CPC .......................... H01L 33/648; H01L 23/473
See application file for complete search history.

(56) References Cited

U.S. PATENT DOCUMENTS 6,351,384 B1    2/2002  Daikoku et al.
2014/0252585 A1  9/2014  Chen et al.

OTHER PUBLICATIONS

Zhang, Yue et al., "Coupled Electrical and Thermal 3D IC Centric Microfluidic Heat Sink Design and Technology," 2011 IEEE, 2011 Electronic Components and Technology Conference, pp. 2037-2044.

*Primary Examiner* — Amar Movva
(74) *Attorney, Agent, or Firm* — Slater Matsil, LLP

(57) ABSTRACT

Packages for semiconductor devices, packaged semiconductor devices, and methods of cooling packaged semiconductor devices are disclosed. In some embodiments, a package for a semiconductor device includes a substrate including a semiconductor device mounting region, a cover coupled to a perimeter of the substrate, and members disposed between the substrate and the cover. The package includes partitions, with each partition being disposed between two adjacent members. The package includes a fluid inlet port coupled to the cover, and a fluid outlet port coupled to one of the partitions.

20 Claims, 21 Drawing Sheets

PACKAGED SEMICONDUCTOR DEVICES

PRIORITY CLAIM

This application claims the benefit to and is a continuation of U.S. patent application Ser. No. 14/981,001, filed on Dec. 28, 2015, and entitled "Packages for Semiconductor Devices, Packaged Semiconductor Devices, and Methods of Cooling Package Semiconductor Devices," which application is a divisional of U.S. patent application Ser. No. 13/791,077, filed on Mar. 8, 2013, now U.S. Pat. No. 9,224,673 issued on Dec. 29, 2015, and entitled the same, both of which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller and more sophisticated packages than packages of the past, in some applications.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging devices and methods for semiconductor devices. Novel packages that include a path for fluid to flow inside the packages to cool the semiconductor devices will be described herein.

Figure 1:
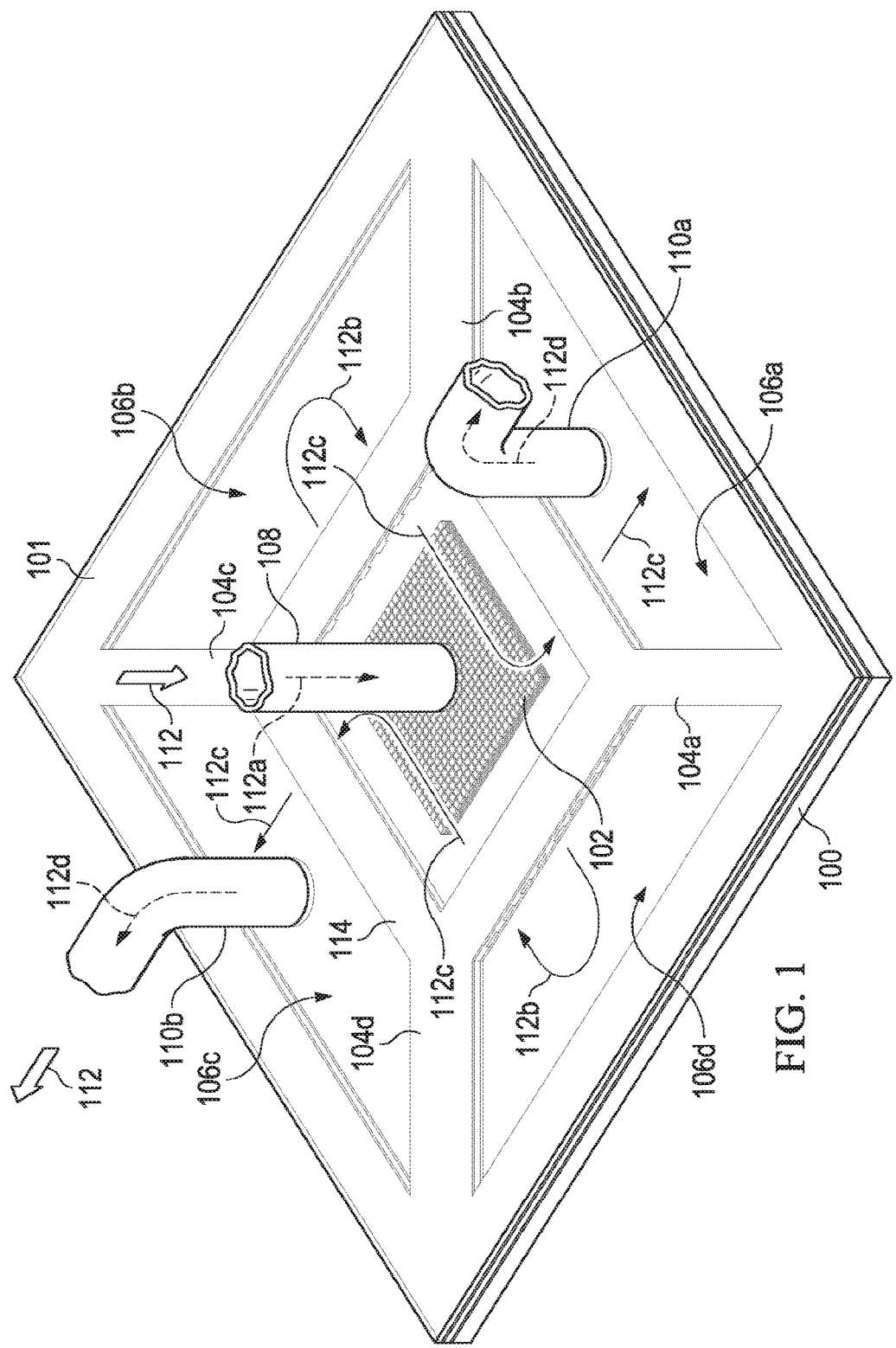
FIG. 1 is a perspective view of a portion of a package for a semiconductor device in accordance with some embodiments of the present disclosure.

FIG. 1 is a perspective view of a portion of a package for a semiconductor device in accordance with some embodiments of the present disclosure. The package includes a packaging substrate 100. The packaging substrate 100 is also referred to herein as a substrate. The packaging substrate 100 includes one or more layers of a non-conductive material, such as a copper clad laminate (CCL) comprising a glass fabric that is coated with electrically insulating resin and is sandwiched between two copper foils, bismaleimide triazine (BT) resin, an epoxy-based resin, or a laminated material such as Ajinomoto Build-up Film (ABF) lamination by Ajinomoto, as examples. Alternatively, the packaging substrate 100 may include other materials. The packaging substrate 100 may include one or more redistribution layers (RDLs) having conductive wiring formed therein, not shown. The RDLs may include fan-out wiring that provides horizontal connections for the package in some embodiments, not shown. In some embodiments, an RDL is not included in the packaging substrate 100.

The package includes an outer ring member 101 disposed on a top surface of a perimeter of the packaging substrate 100. The outer ring member 101 is disposed around a perimeter of the substrate 100 in some embodiments. A semiconductor device mounting region 102 is disposed on a top surface of the packaging substrate 100. The semiconductor device mounting region 102 is disposed on a central region of the packaging substrate 100 in some embodiments, for example. Alternatively, the semiconductor device mounting region 102 may be disposed in other regions of the packaging substrate 100. The semiconductor device mounting region 102 is substantially square or rectangular in some embodiments. Alternatively, the semiconductor device mounting region 102 may comprise other shapes. The outer ring member 101 is disposed around and spaced apart from the semiconductor device mounting region 102.

A plurality of members 104a, 104b, 104c, and 104d are disposed over the packaging substrate 100. Each of the plurality of members 104a, 104b, 104c, and 104d comprises an elongated diagonal member that extends from a corner of the substrate 100 to a corner of the semiconductor device mounting region 102 in some embodiments. An inner ring member 114 is disposed around a perimeter of the semiconductor device mounting region 102. The plurality of members 104a, 104b, 104c, and 104d are disposed on the substrate 100 between the outer ring member 101 and the inner ring member 114 in some embodiments.

A plurality of partitions 106a, 106b, 106c, and 106d are disposed over the substrate 100. The sides of the partitions 106a, 106b, 106c, and 106d are defined by a portion of the outer ring member 101, the inner ring member 114, and two adjacent members 104a, 104b, 104c, and 104d. The top and bottom of the partitions 106a, 106b, 106c, and 106d are defined by the cover 129 (not shown in FIG. 1; see FIG. 3) and the substrate 100, respectively. For example, partition 106a is disposed between members 104a and 104b, partition 106b is disposed between members 104b and 104c, partition 106c is disposed between members 104c and 104d, and partition 106d is disposed between members 104d and 104a. Each partition 106a, 106b, 106c, and 106d comprises a trapezoidal shape in some embodiments. In some embodiments, the package comprises four partitions 106a, 106b, 106c, and 106d. Alternatively, other numbers of partitions 106a, 106b, 106c, and 106d may be included in the package, and the partitions 106a, 106b, 106c, and 106d may comprise other shapes, not shown.

The outer ring member 101, the inner ring member 114, and members 104a, 104b, 104c, and 104d may comprise a width in a top view of about 1 mm to about 4 mm and a thickness in a cross-sectional view of about 300 µm to about 1 mm, as examples. The outer ring member 101, the inner ring member 114, members 104a, 104b, 104c, and 104d, and cover 129 may comprise copper, copper tungsten alloy, copper graphite, aluminum-silicon-carbide (AlSiC), machinable ceramic, aluminum nitride, or multiple layers or combinations thereof, as examples. Alternatively, the outer ring member 101, the inner ring member 114, and members 104a, 104b, 104c, and 104d may comprise other dimensions and materials.

Figure 3:
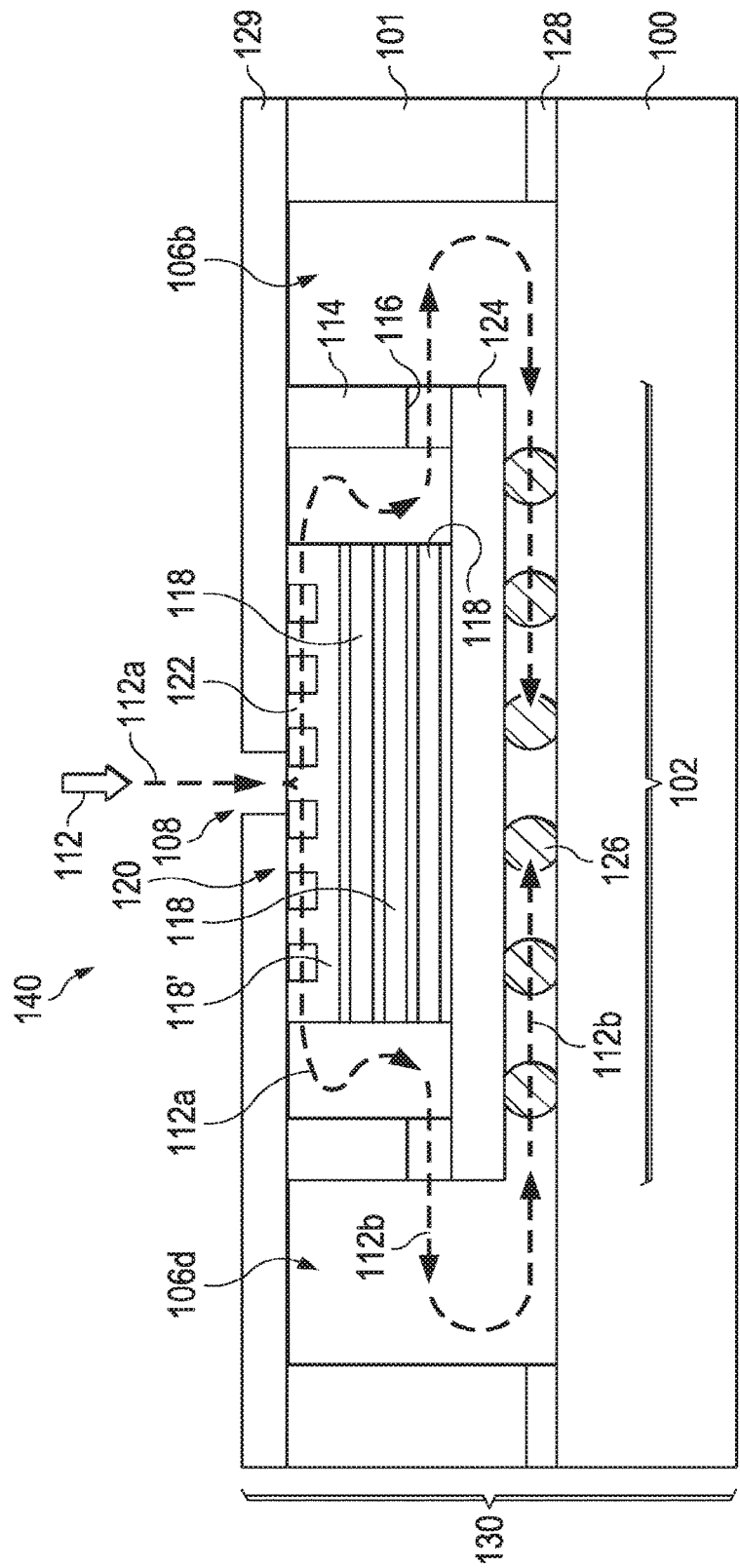
FIG. 3 is a cross-sectional view of a packaged semiconductor device in accordance with some embodiments.

The package includes an input port 108 that is coupled to a cover 129 (see FIG. 3). The input port 108 comprises a fluid input port in some embodiments, for example. The package includes at least one output port 110a. In some embodiments, the package includes a plurality of output ports 110a and 110b. In some embodiments, the package includes two output ports 110a and 110b. The output ports 110a and 110b comprise fluid output ports in some embodiments, for example. The ports 108, 110a, and 110b comprise pipes or openings where pipes or piping can be inserted in order to introduce a fluid 112 inside the package to cool a semiconductor device coupled to the semiconductor device mounting region 102, for example, to be described further herein. The fluid input port 108 is also referred to herein as an input port or a fluid inlet port. The fluid output ports 110a and 110b are also referred to herein as output ports or fluid outlet ports.

The fluid output ports 110a and 110b are each coupled to one of the plurality of partitions. For example, in FIG. 1, fluid output port 110a is coupled to partition 106a, and fluid output port 110b is coupled to partition 106c. The fluid output ports 110a and 110b are coupled to the cover 129 over partitions 106a and 106c, respectively. The fluid input port 108 is coupled to the cover over the semiconductor device mounting region 102.

To cool a semiconductor device mounted on the semiconductor device mounting region 102 after the semiconductor device is packaged, a fluid 112 is introduced into the package via the fluid input port 108. The fluid 112 comprises a non-electrically conductive liquid in some embodiments, for example. The fluid 112 comprises a non-electrically conductive liquid during the passing of the fluid through the package in some embodiments, for example. In some embodiments, the fluid 112 comprises an insulating liquid, as another example. The fluid 112 comprises a heat transfer fluid, e.g., and comprises a coolant in some embodiments. In some embodiments, the fluid comprises Freon™ (e.g., a trademark of Du Pont), Polyalphaolefin (PAO) liquid, R-134a working fluid, thermal fluid FC-72 by 3M, HFE-7100, refrigerant R-123, perfluoropolyether, a fluorinated refrigerant, a nanofluid comprising nanoparticles comprised of SiC, CuO, and/or $Al_2O_3$, other liquids, and/or combinations thereof, as examples. Alternatively, the fluid 112 may comprise other materials.

Figure 2:
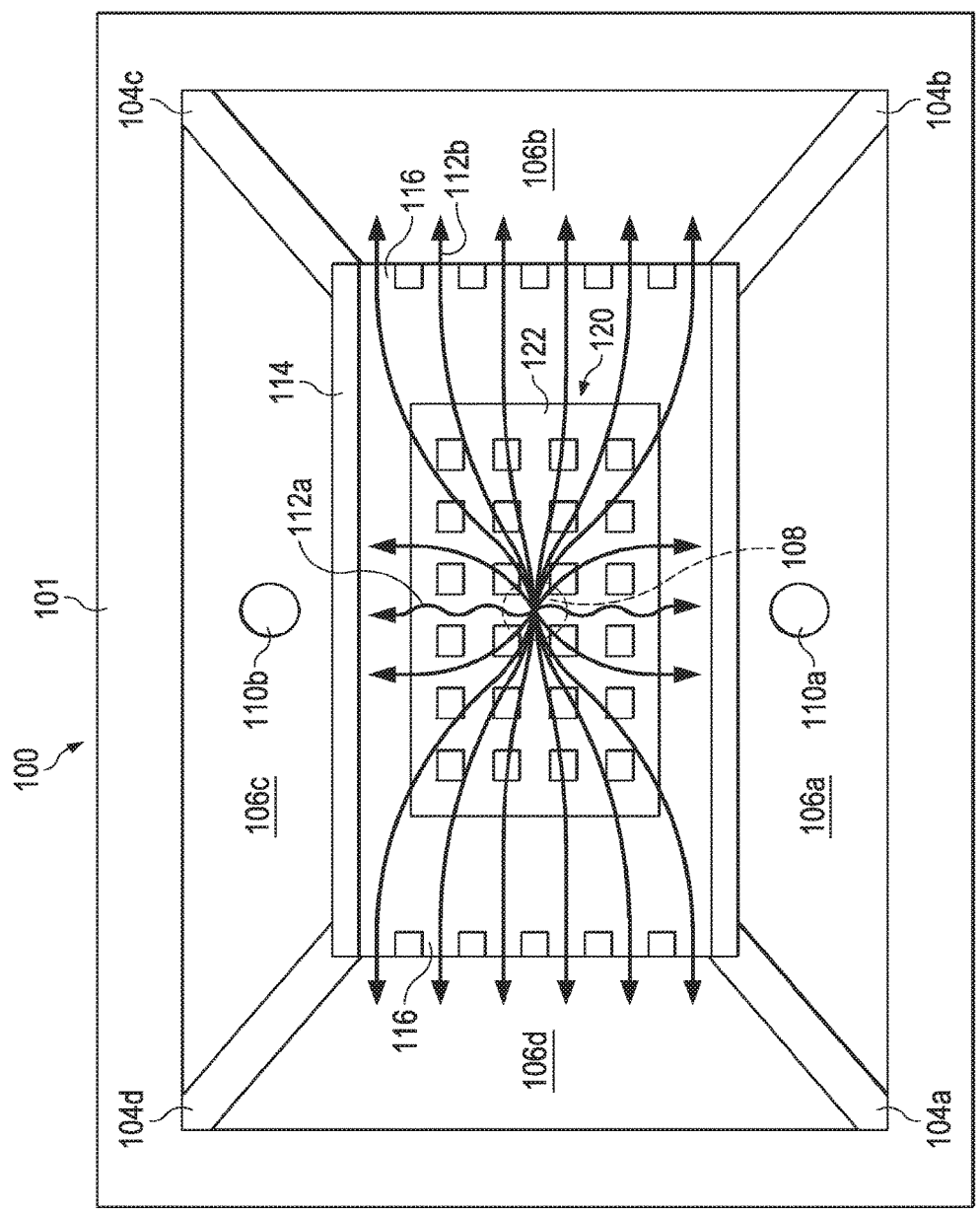
FIG. 2 is a top view of a portion of a package for a semiconductor device in accordance with some embodiments.

The path of the fluid 112 through the package is shown at 112a, 112b, 112c, and 112d. FIG. 2 is a top view of a portion of a package for a semiconductor device, and FIG. 3 is a cross-sectional view of a packaged semiconductor device 140 in accordance with some embodiments. The fluid 112 path is also illustrated in FIGS. 2 and 3 at 112a and 112b. The inner ring member 114 includes a plurality of apertures 116 (see FIGS. 2 and 3) to allow the fluid 112 to flow through portions of the inner ring member 114 in some embodiments. For example, the apertures 116 are disposed on sides of the inner ring member 114 that are adjacent partitions 106b and 106d in FIG. 2.

A semiconductor device 120 is also shown mounted to the semiconductor device mounting region 102 in FIG. 3. In some embodiments, the semiconductor device 120 comprises a partially packaged semiconductor device, for example. In other embodiments, the semiconductor device 120 comprises one or more integrated circuit dies 118 coupled to an interposer substrate 124. The semiconductor device 120 comprises one or more integrated circuit dies 118 coupled vertically or horizontally over the interposer substrate 124, in some embodiments, as examples. The inner ring member 114 is disposed around a perimeter of the interposer substrate 124 in some embodiments, for example. The inner ring member 114 may be coupled to the perimeter of the interposer substrate 124 by an adhesive, for example, not shown. The inner ring member 114 is coupled between the interposer substrate 124 and the cover 129 in FIG. 3, for example. The interposer substrate 124 is coupled to the packaging substrate 100 by a plurality of conductive bumps 126. The conductive bumps 126 may be coupled between contact pads on the interposer substrate 124 and contact pads on the packaging substrate 100, for example, not shown. The conductive bumps 126 may comprise controlled collapse chip connections (C4), microbumps, or other types of electrical connections, as examples. In some embodiments, the semiconductor device 120 comprises a through interposer stacking (TIS) device or a through transistor stacking (TTS) device, as examples. Alternatively, the semiconductor device 120 may comprise other types of devices.

A top surface of the semiconductor device 120 includes a plurality of fins 122 in some embodiments. The fins 122 are spaced apart by a predetermined amount of space, such as about 50 µm to about 500 µm, for example, which allows the fluid 112 to flow through the fins 122. Alternatively, the fins 122 may be spaced apart by other distances. The fins 122 comprise micro pin fins comprised of a material such as silicon, solder, or glass. The fins 122 may comprise a width in a cross-sectional view of about 50 μm to about 500 μm, for example. Alternatively, the fins 122 may comprise other materials and dimensions. The semiconductor device 120 includes a TTS device comprising a plurality of vertically stacked dies 118 and 118', wherein an upper-most die 118' of the TTS device comprises the plurality of fins 122 in the embodiment shown in FIGS. 2 and 3, for example. Alternatively, the semiconductor device 120 may include a plurality of dies 118 that are mounted adjacent one another horizontally over the interposer substrate 124, not shown, and the fluid 112 flows between the horizontally positioned dies 118, not shown in the drawings.

Figure 4:
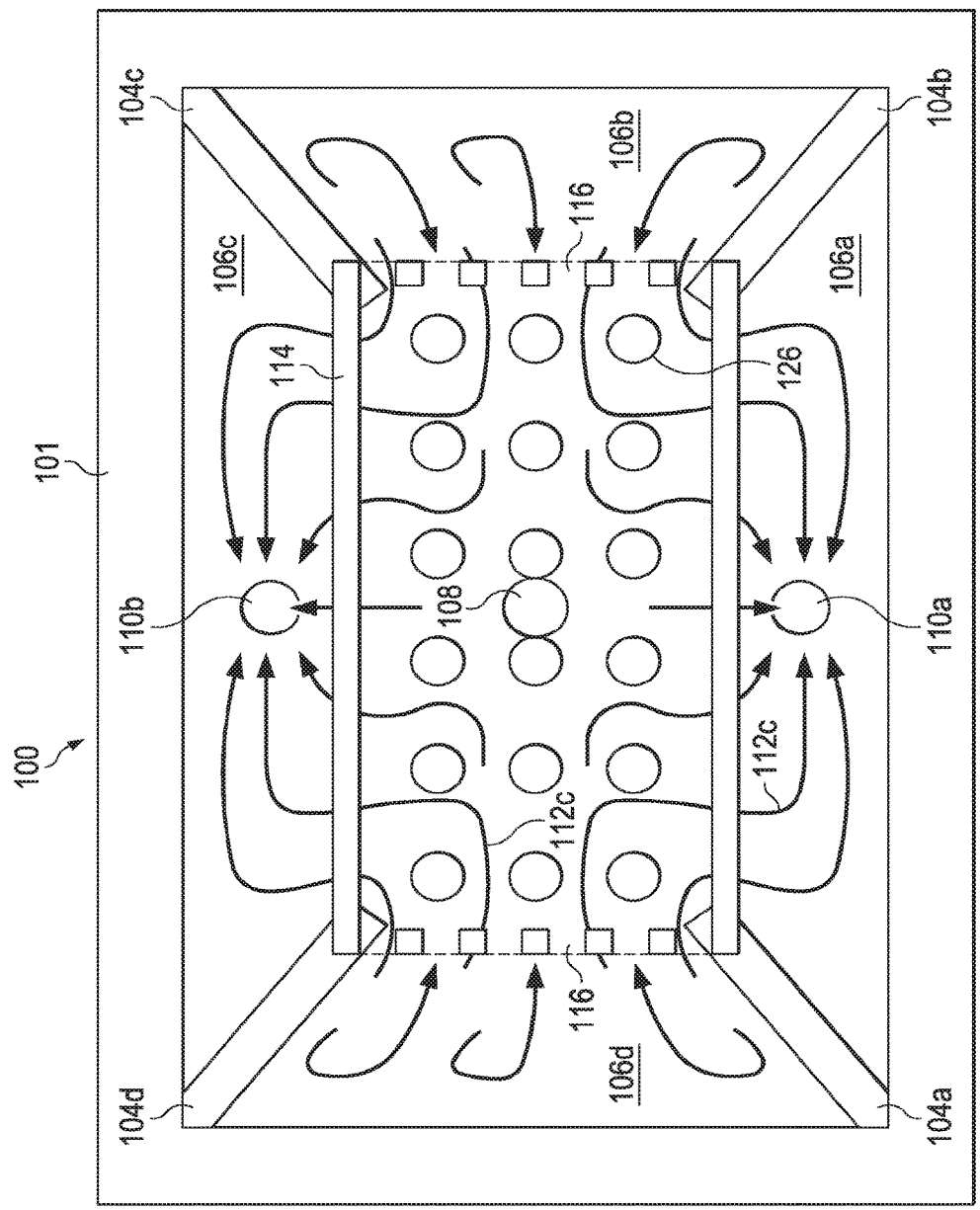
FIG. 4 is a top view of a portion of a package for a semiconductor device in accordance with some embodiments.
Figure 5:
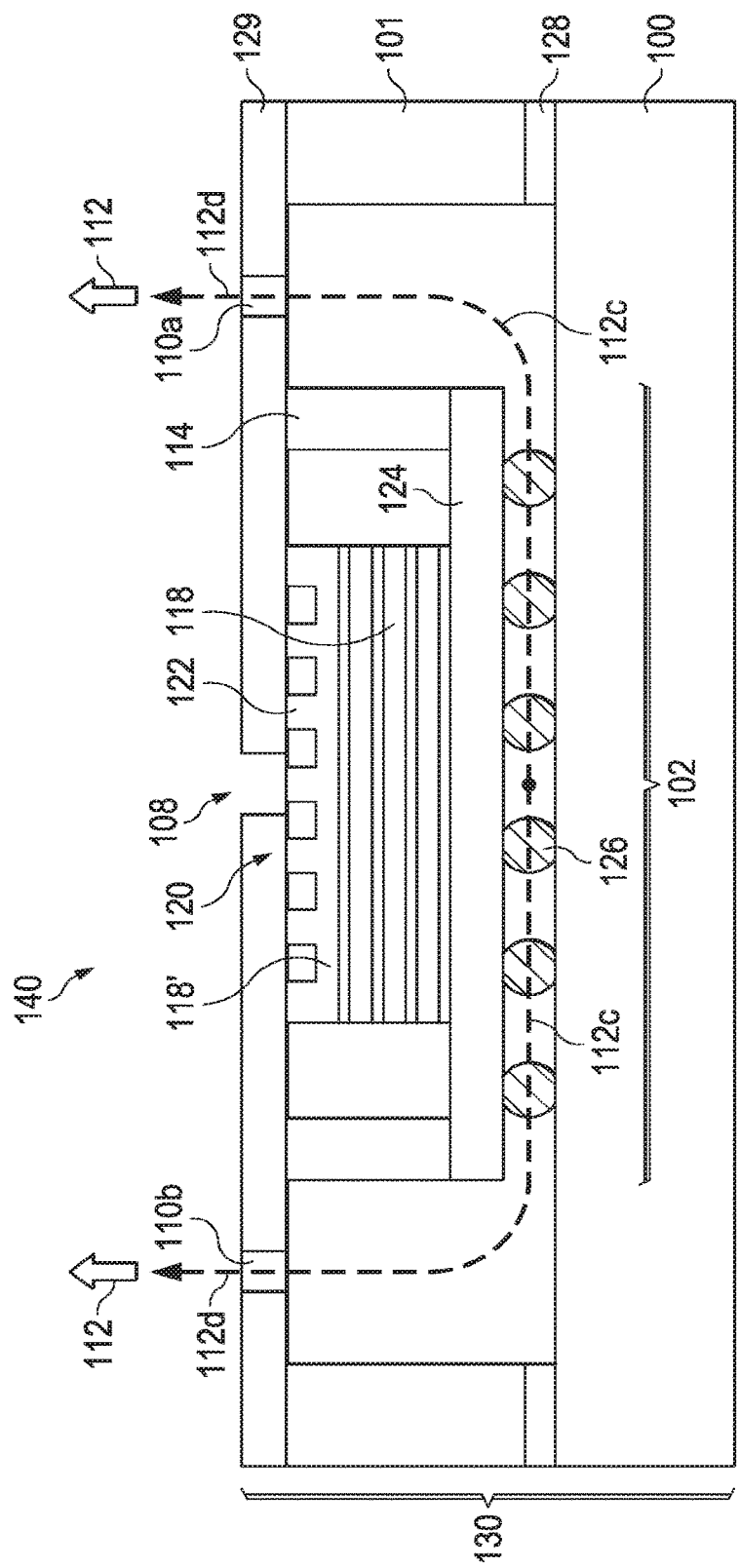
FIG. 5 is a cross-sectional view of a packaged semiconductor device in accordance with some embodiments.

The fluid 112 is introduced into the input port 108 at stage 112a of the fluid 112 flow, as shown in FIGS. 1, 2, and 3. The fluid 112 travels into the input port 108 in the cover 129 and passes between the fins 122 into a region between edges of the semiconductor device 120 and the inner ring member 114 at stage 112a of the fluid 112 flow. The fluid 112 passes through the apertures 116 in the inner ring member 114 and into partitions 106b and 106d at stage 112b of the fluid 112 flow. At stage 112c of the fluid 112 flow, the fluid 112 passes from partitions 106b and 106d underneath the interposer 124 between the conductive bumps 126 to partitions 106a and 106c, as shown in FIG. 1 and also in a top view in FIG. 4 and a cross-sectional view in FIG. 5. At stage 112d of the fluid 112 flow, the fluid 112 flows from partitions 106a and 106c and leaves the package through the output ports 110a and 110b, as shown in FIG. 1 and FIG. 5. The fluid 112 is cooled by an external device and reflowed back into the input port 108 of the package 130. In some embodiments wherein one or more integrated circuit dies 118 are coupled vertically or horizontally over the interposer substrate 124, passing the fluid 112 comprises flowing the fluid 112 from the inlet port 108 through an upper-most one of the integrated circuit dies 118', and fully circulating the fluid 112 through each of the vertically or horizontally coupled integrated circuit dies 118 and 118', for example. In embodiments wherein a plurality of integrated circuit dies 118 is coupled vertically over the interposer substrate 124 in a vertical stack, the fluid 112 is passed through the entire stack-up of integrated circuit dies 118 and 118', as another example.

The package 130 for a semiconductor device 120 shown in FIGS. 3 and 5 in the cross-sectional views includes the packaging substrate 100 including the semiconductor device mounting region 102, and the outer ring member 101 disposed between the cover 129 and the packaging substrate 100 at a perimeter of the packaging substrate 100. The outer ring member 101 may be attached to the packaging substrate 100 by an adhesive 128. The package 130 also includes the input port 108 and the output ports 110a and 110b. The package 130 further includes the members 104a, 104b, 104c, and 104d shown in FIGS. 1, 2, and 4, and the inner ring member 114 which is disposed between the cover 129 and the semiconductor device mounting region 102, for example. The package 130 also includes the partitions 106a, 106b, 106c, and 106d that are defined by the members 104a, 104b, 104c, and 104d, outer ring member 101, inner ring member 114, the cover 129, and the packaging substrate 100.

The packaged semiconductor device 140 shown in FIGS. 3 and 5 includes the package 130 described above, and also includes the semiconductor device 120 that includes a plurality of stacked dies 118 and 118' mounted on the interposer substrate 124 which is mounted on the packaging substrate 100 by the conductive bumps 126.

Figure 6:
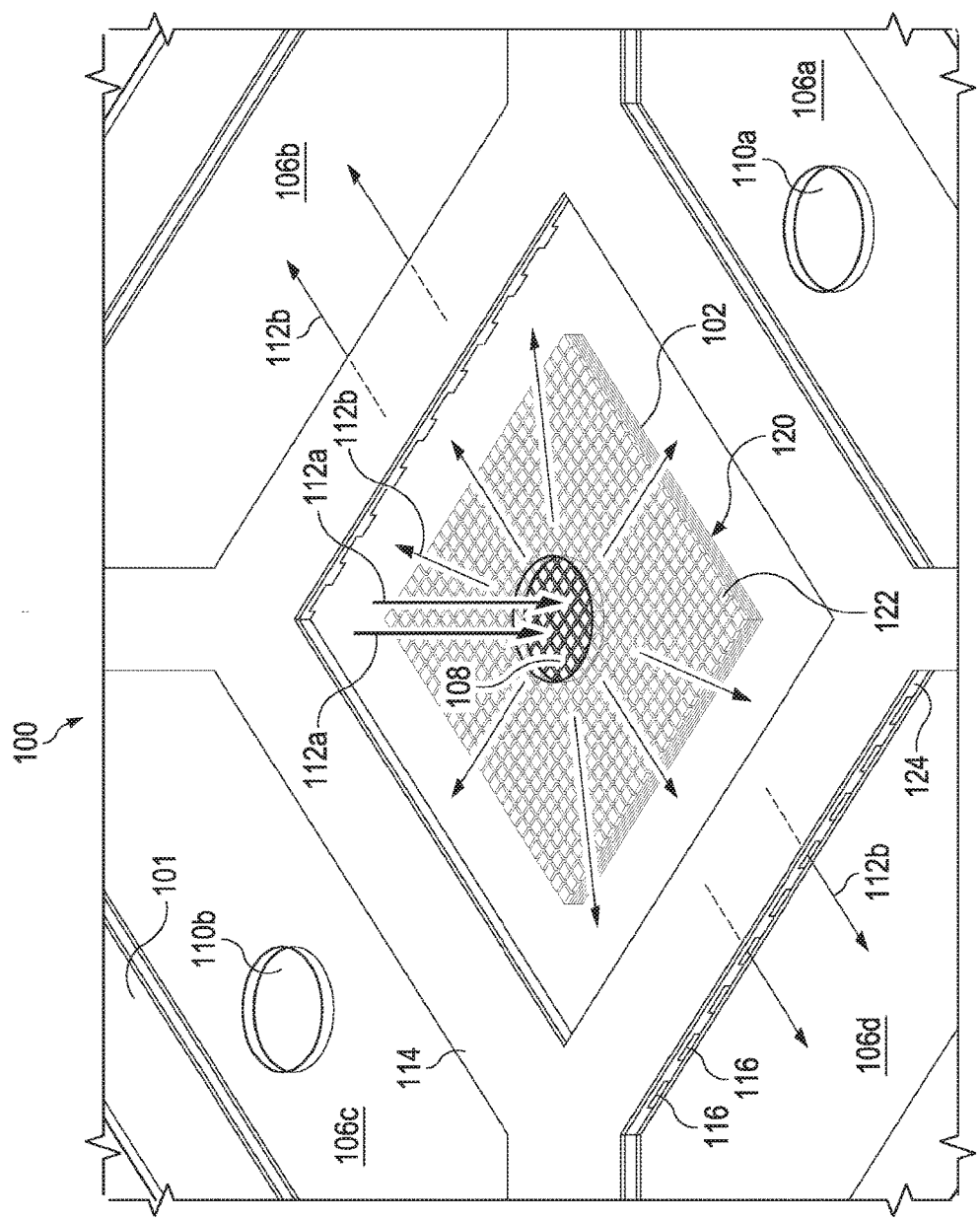
FIGS. 6 through 10 are perspective views showing portions of a package for a semiconductor device in accordance with some embodiments.
Figure 7:
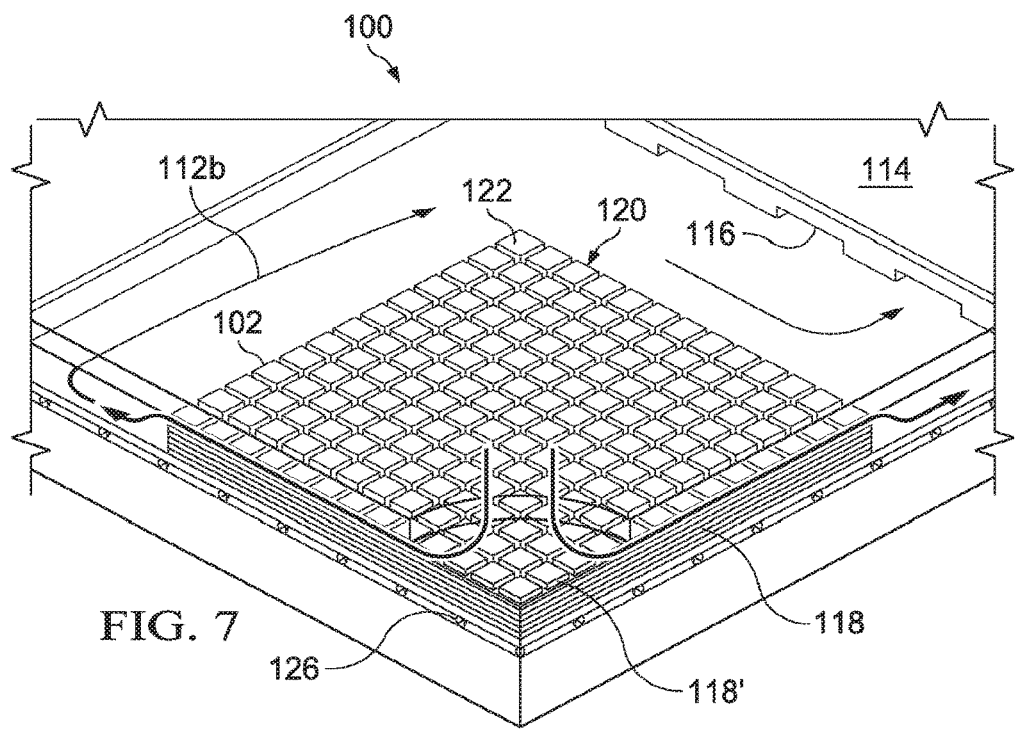
Figure 9:
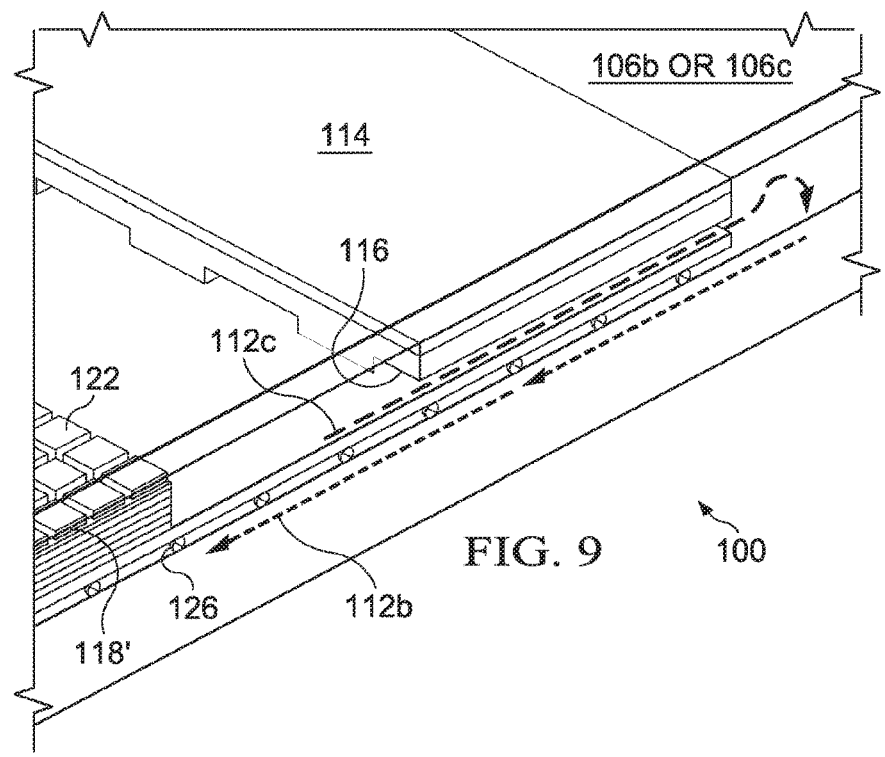
Figure 8:
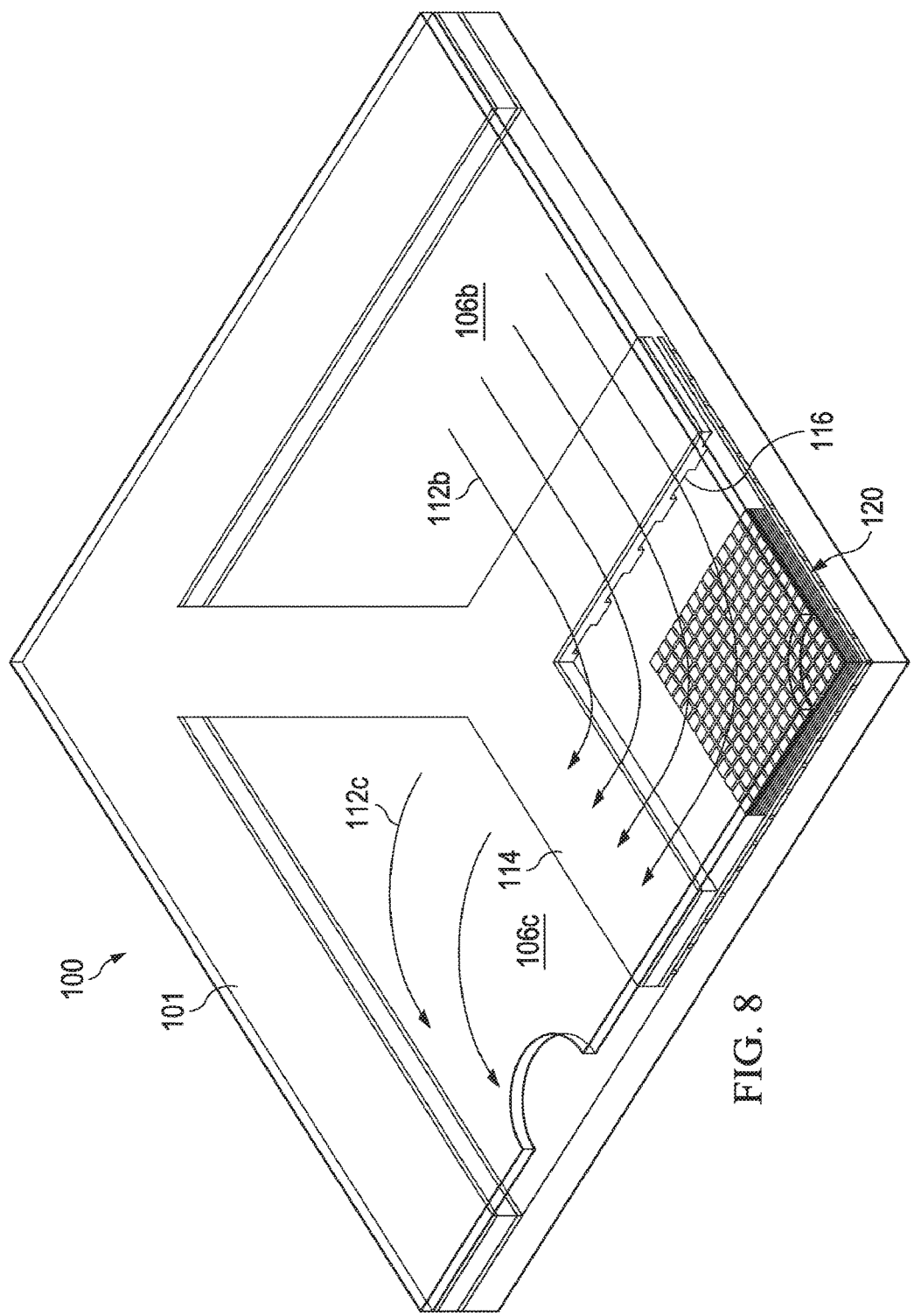
Figure 10:
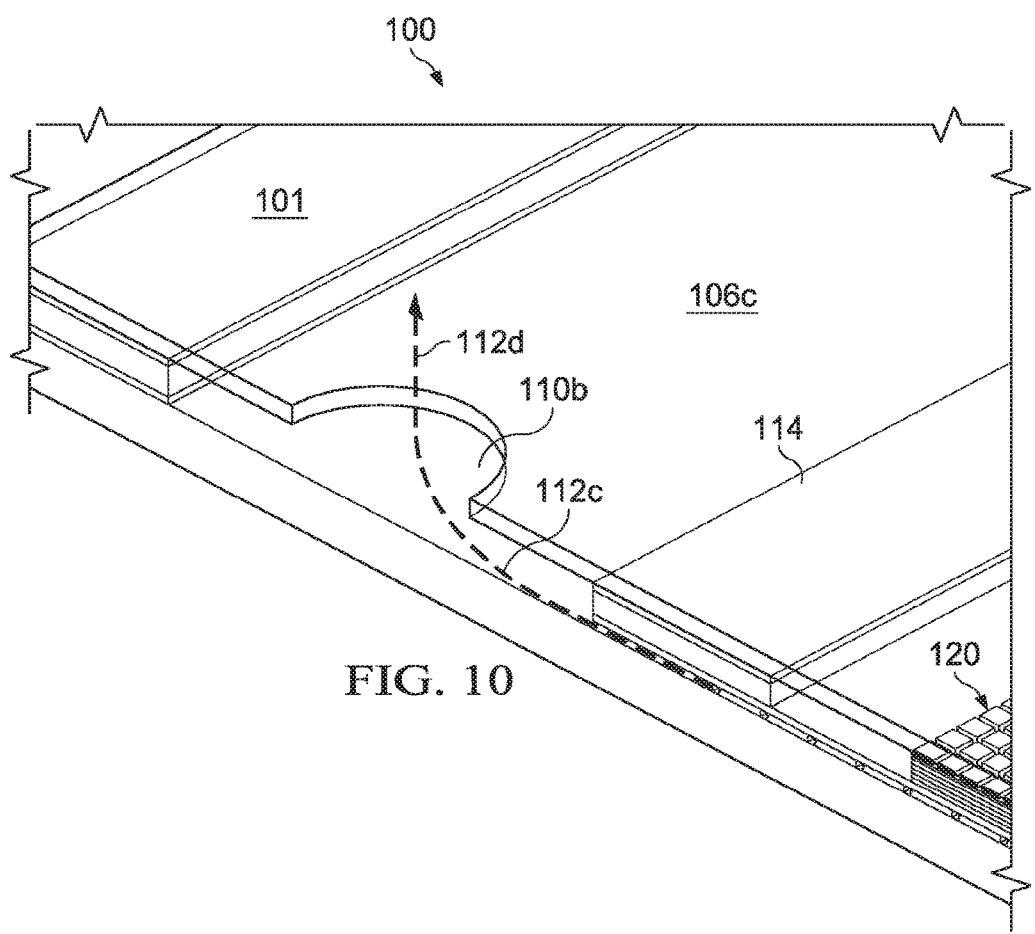

FIGS. 6 through 10 are perspective views showing portions of packages 130 for semiconductor devices 120 (see FIGS. 3 and 5) in accordance with some embodiments. Various portions of the packages 130 and various stages 112a, 112b, 112c, and 112d of the fluid 112 flow are shown in more detail. In FIG. 6, fluid entering the input port 108 is shown at 112a, and fluid flowing through the fins 122 on the top surface of the semiconductor device 120 is shown at 112b. Fluid flowing through the apertures 116 in the inner ring member 114 is also shown at 112b. In FIG. 7, fluid flowing through the fins 122 and into a region between the semiconductor device 120 and the inner ring member 114 and into an aperture 116 in the inner ring member 114 is shown at 112b. In FIG. 8, fluid flowing from partition 106b underneath the semiconductor device 120 is shown at 112b, and fluid flowing from beneath the semiconductor device 120 and into partition 106c is shown at 112c. In FIG. 9, fluid flowing into and out of a partition 106b or 106c is shown at 112b and 112c, respectively, through conductive bumps 126 or apertures 116 in the inner ring member 114. In FIG. 10, fluid flowing into a partition 106c is shown at 112c, and fluid flowing out of an output port 110b is shown at 112d.

Figure 11:
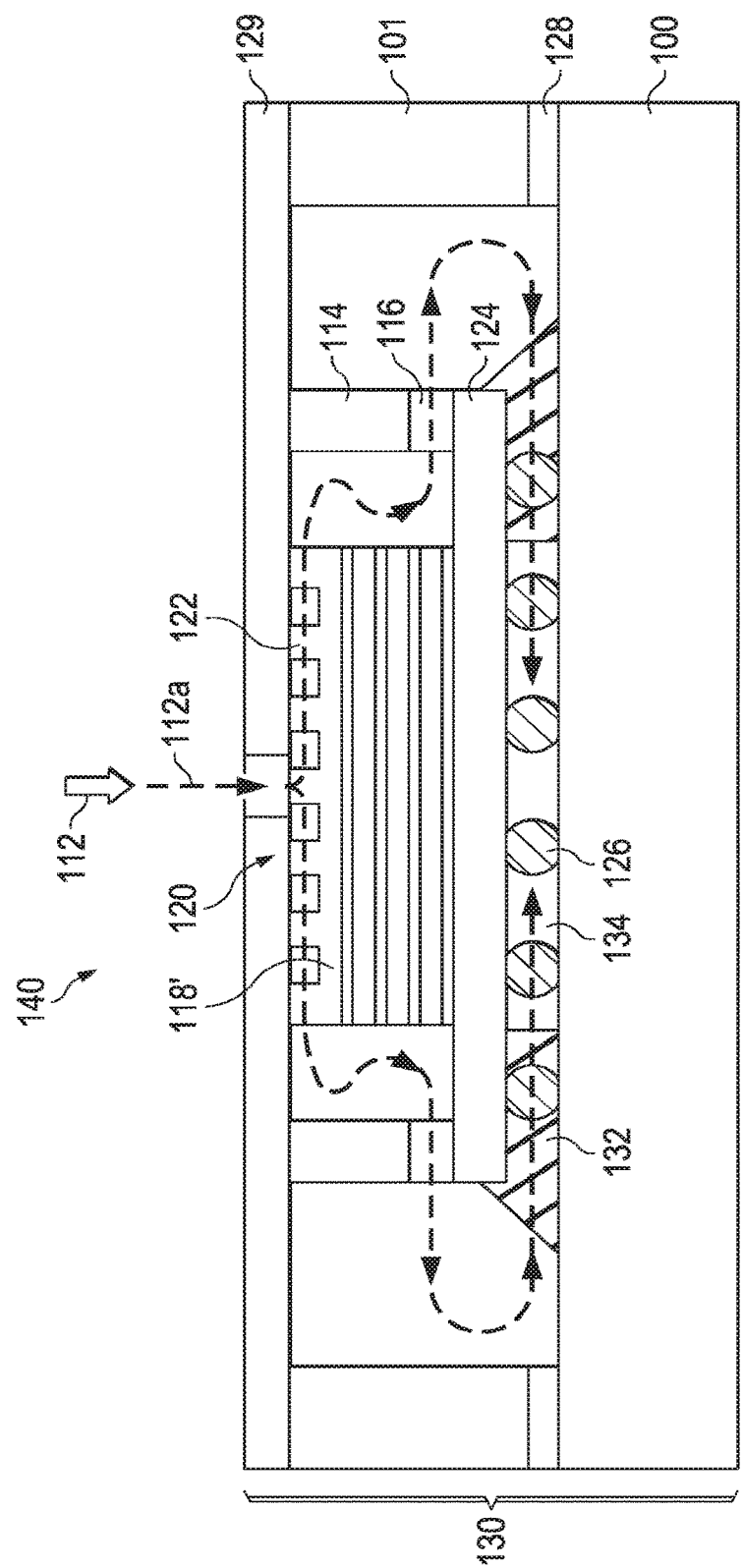
FIG. 11 is a cross-sectional view of a packaged semiconductor device in accordance with some embodiments.

FIG. 11 is a cross-sectional view of a packaged semiconductor device 140 in accordance with some embodiments. An underfill material 132 is disposed beneath a portion of the interposer substrate 124. The underfill material 132 encapsulates some of the conductive bumps 126 in some embodiments. The underfill material 132 includes one or more channels that extend from a first side of the interposer substrate 124 to a second side of the interposer substrate 124 in some embodiments, to allow the fluid 112 to flow beneath the semiconductor device 120.

Figure 12:
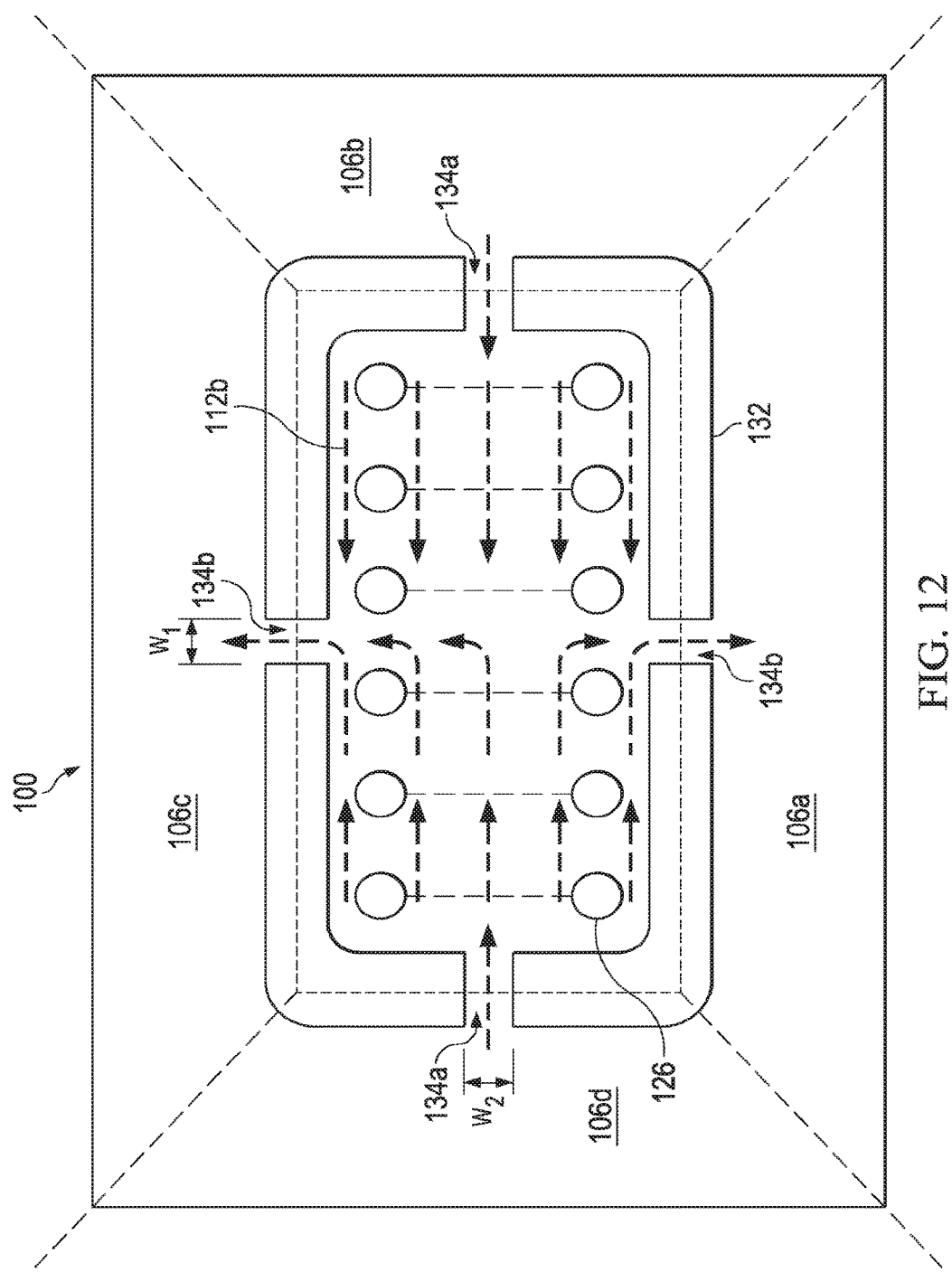
FIGS. 12 through 16 illustrate top views of a portion of a package for a semiconductor device in accordance with some embodiments.

FIGS. 12 through 16 illustrate top views of a portion of a package 130 for a semiconductor device in accordance with some embodiments. Various configurations of the underfill material 132 in a top view in accordance with some embodiments are illustrated. In FIG. 12, the underfill material 132 comprises a peripheral pattern around the plurality of conductive bumps 126. Openings 134a and 134b in the underfill material 132 allow fluid 112 to flow beneath the semiconductor device 120. Openings 134a comprise a width $w_1$, and openings 134b comprise a width $w_2$, wherein widths $w_1$ and $w_2$ comprise about several μm to several mm in some embodiments. Alternatively, widths $w_1$ and $w_2$ may comprise other dimensions. Width $w_1$ may be the same as width $w_2$, or width $w_1$ may be different than width $w_2$, for example.

Figure 13:
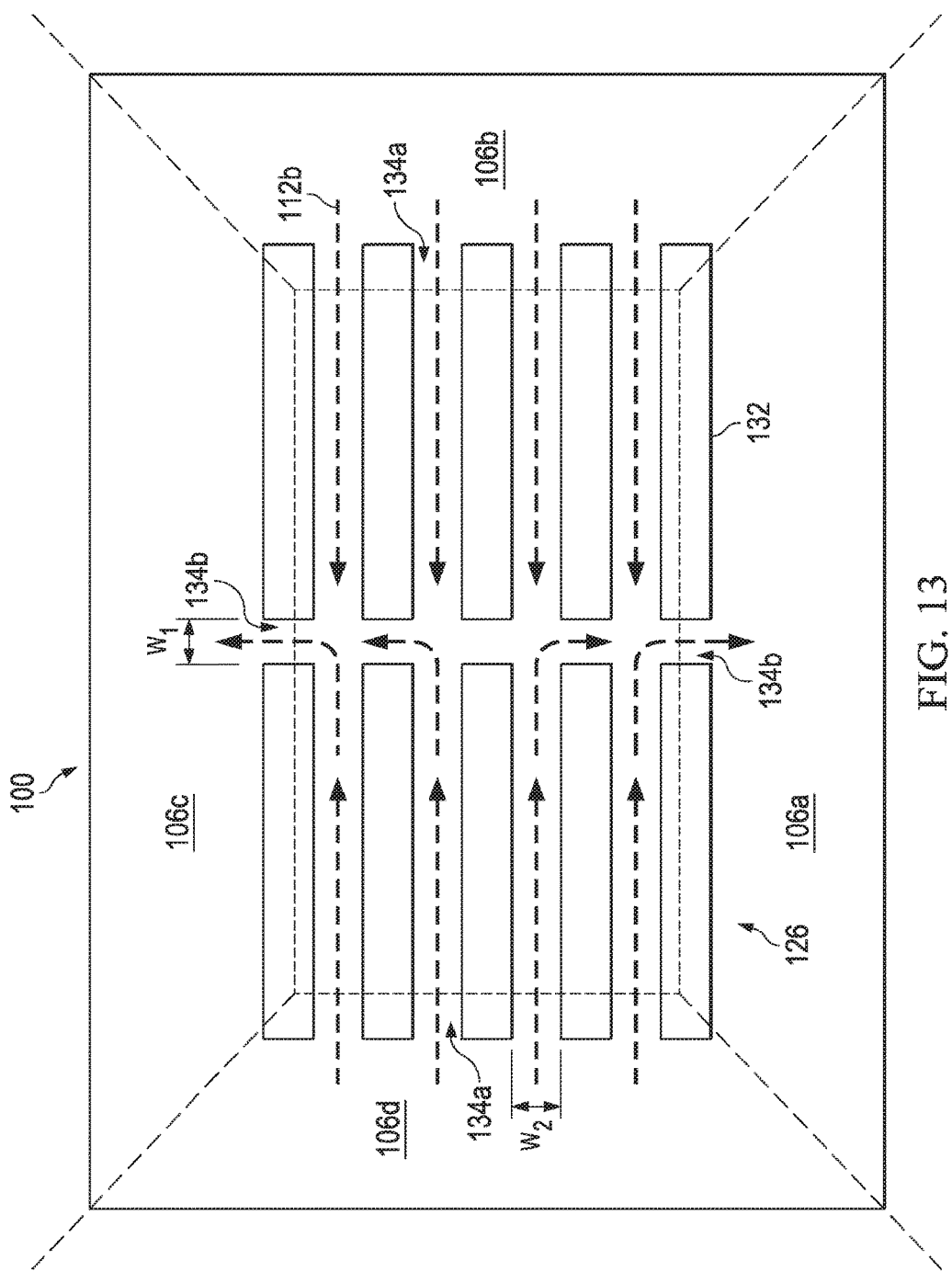
Figure 14:
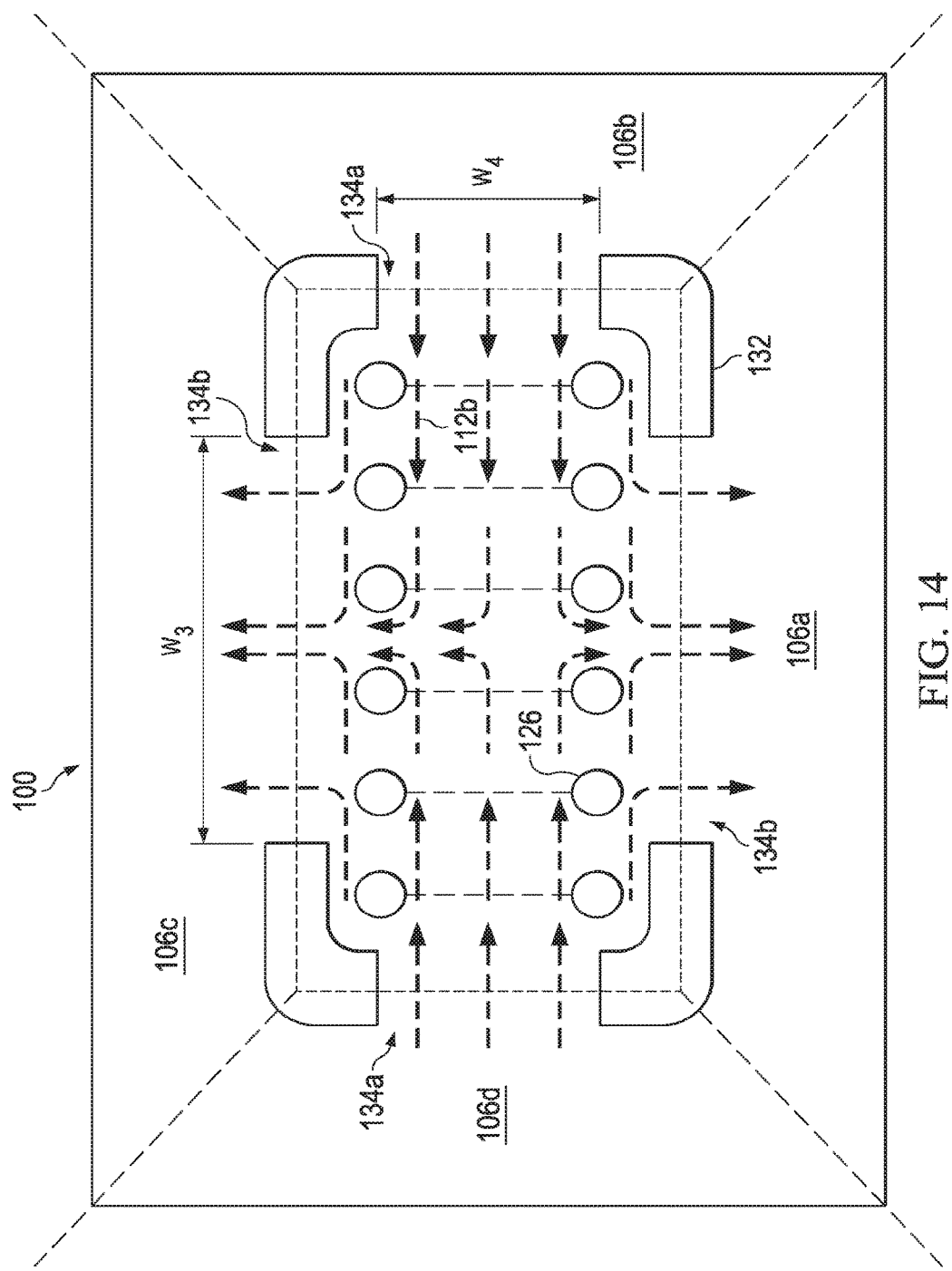
Figure 15:
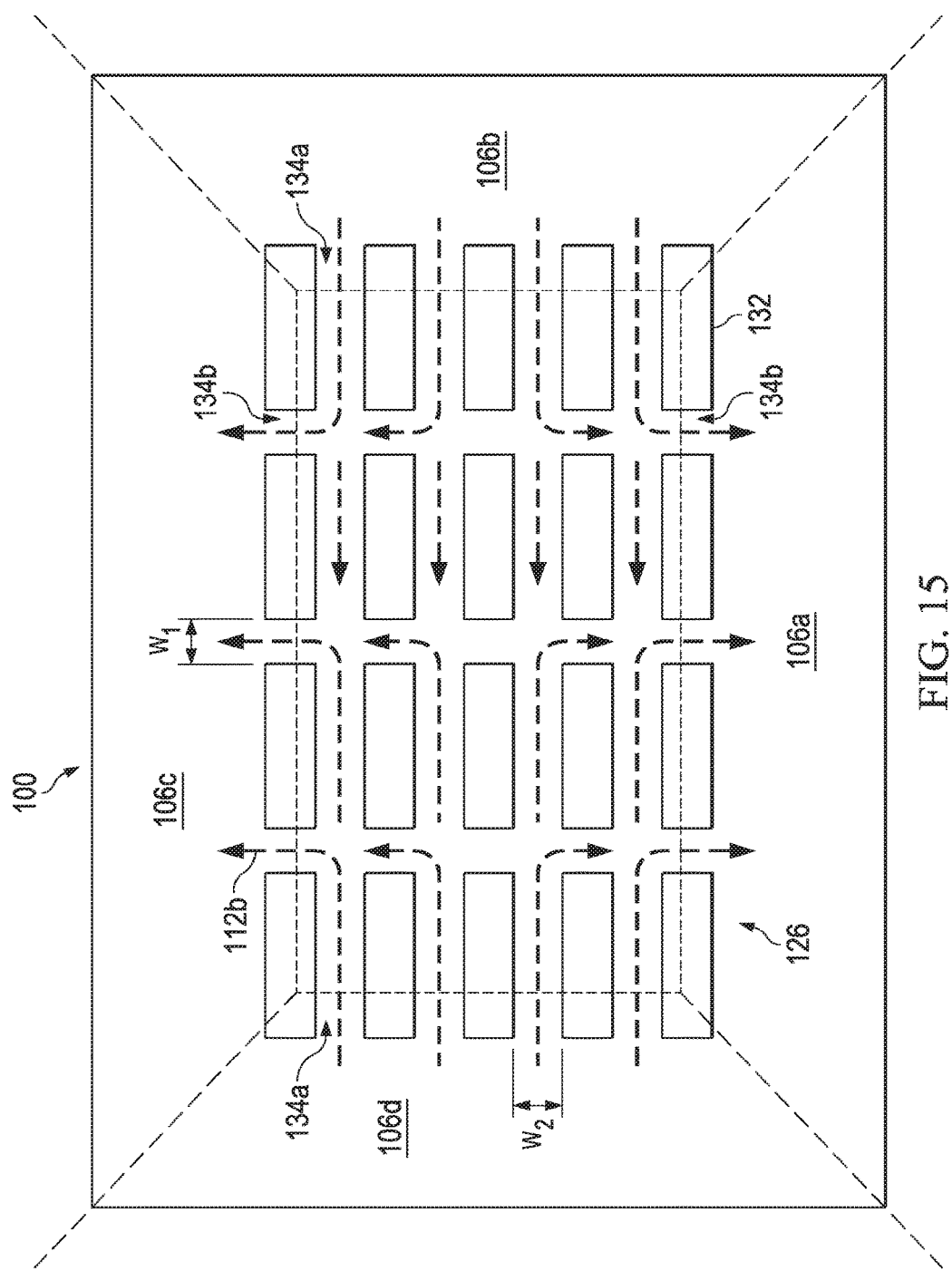

In other embodiments, the underfill material 132 may comprise a parallel strip pattern around the plurality of conductive bumps 126, as shown in FIG. 13. Alternatively, the underfill material 132 may comprise a corner pattern around the plurality of conductive bumps 126, as shown in FIG. 14. The widths $w_3$ and $w_4$ of the openings 134a and 134b in the underfill material 132 may be larger than width $w_1$ and $w_2$ of the openings 134a and 134b in the other embodiments, for example. The widths $w_3$ and $w_4$ may comprise about half of a length of a side of the semiconductor device 120 or greater in some embodiments, for example. Alternatively, the underfill material 132 may comprise a tile pattern around the plurality of conductive bumps 126, as shown in FIG. 15. Two or more adjacent conductive bumps 126 may be encapsulated with the underfill material 132 to form the tile pattern, for example.

The underfill material 132 enhances bonding of the conductive bumps 126 and also provides a liquid channeling structure, in some embodiments, for example.

Figure 19:
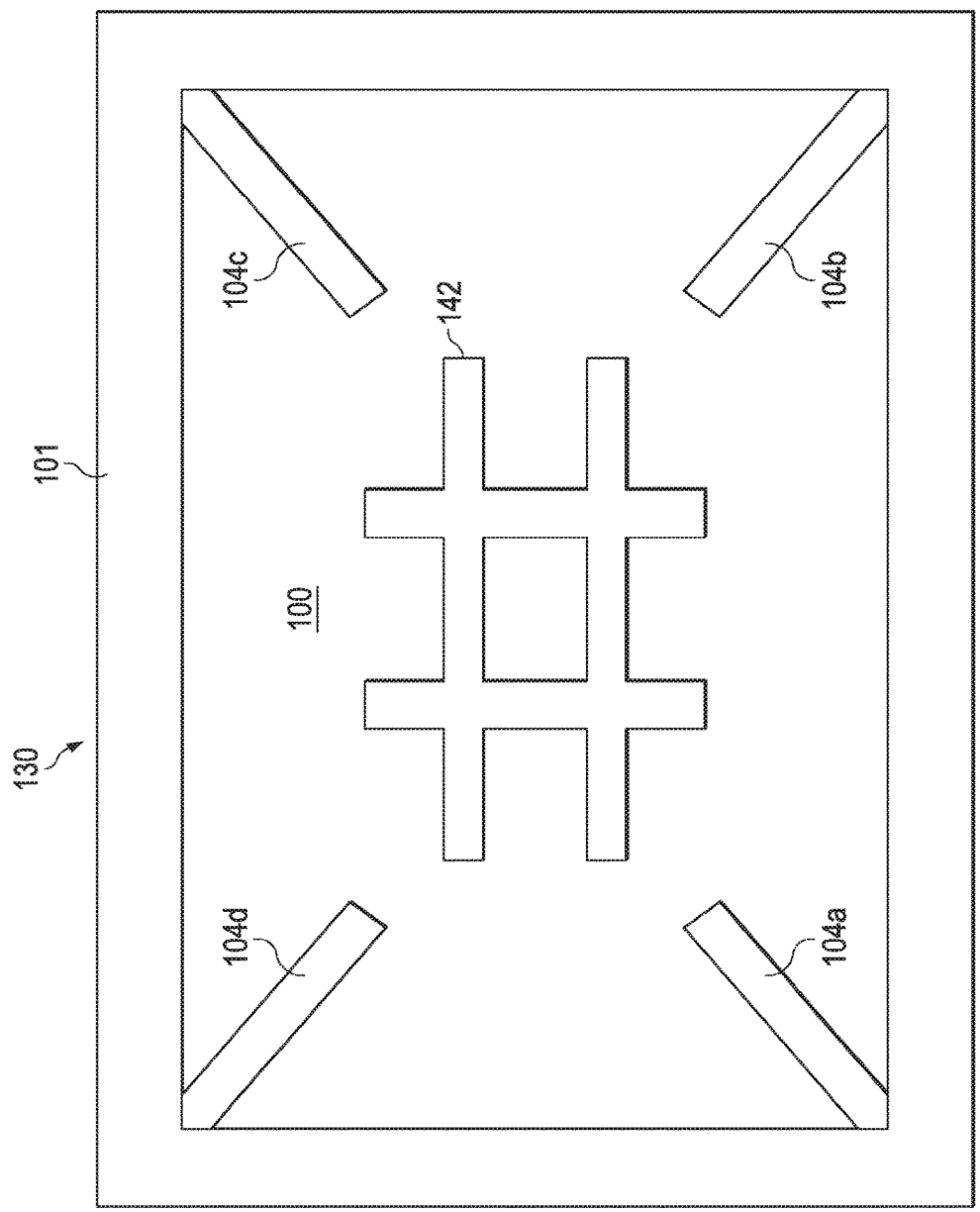

An underfill material non-wettable treatment 142 may be formed on the top surface of the packaging substrate 100 in order to prevent the underfill material 132 from forming in predetermined locations, to be described further herein with reference to FIG. 19. The underfill material 132 may be partially cured to achieve the patterns of the underfill material 132 shown in FIGS. 12 through 15, for example.

Figure 16:
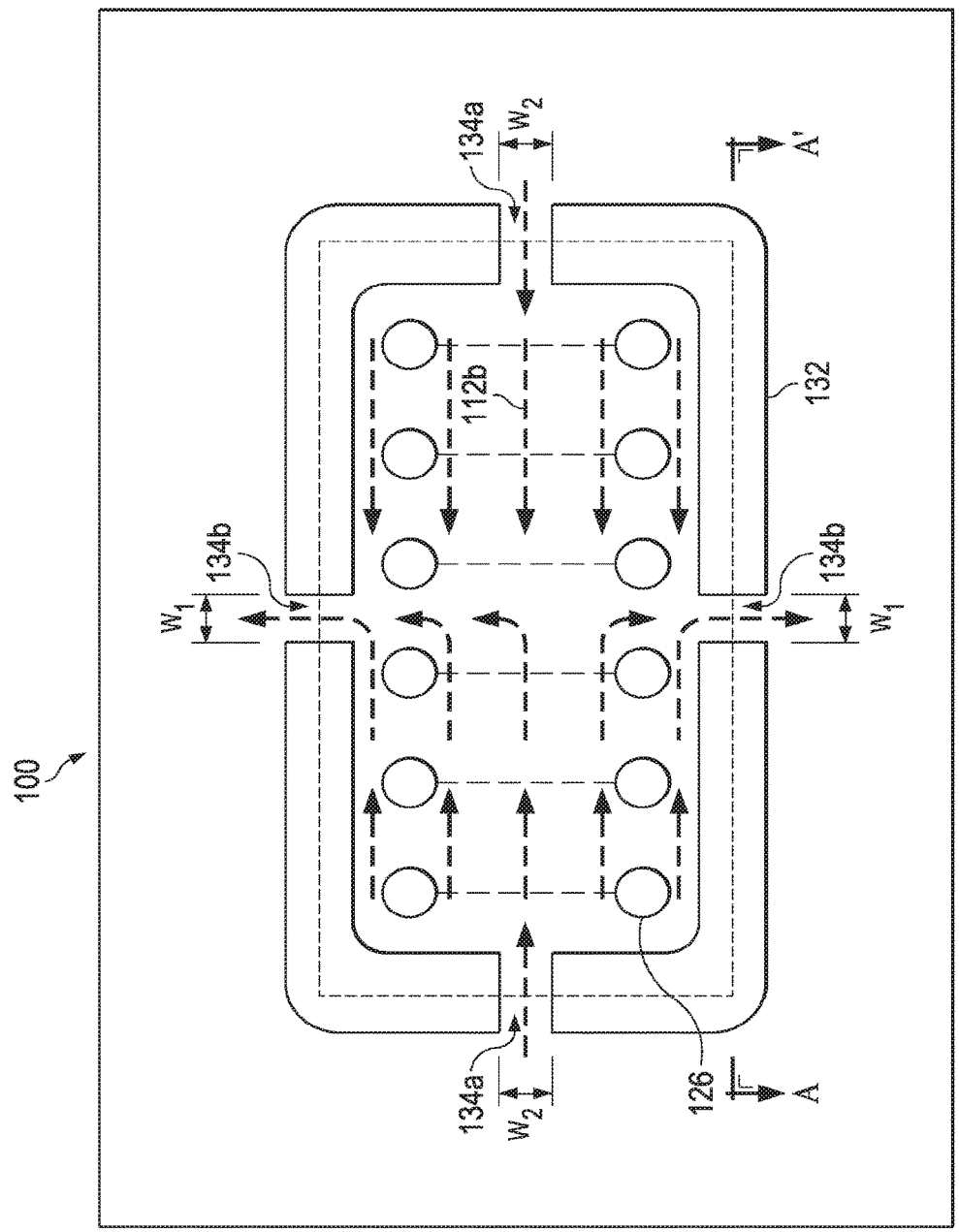
Figure 17:
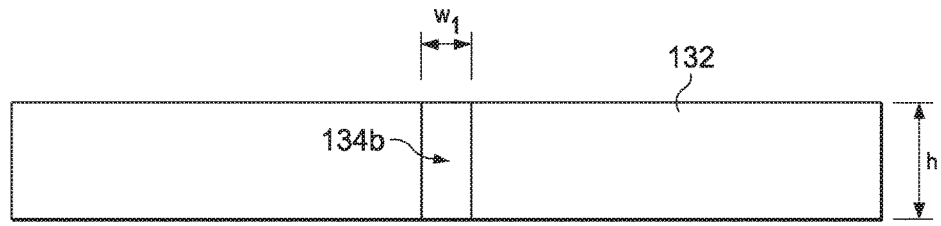
FIG. 17 is a cross-sectional view of the portion of the package for a semiconductor device shown in FIG. 16.

FIG. 16 illustrates a method a determining a width of the openings 134a and 134b in the underfill material 132. FIG. 17 is a cross-sectional view of the portion of the package for a semiconductor device shown in FIG. 16 at A-A'. A pressure drop is required to ensure that the fluid 112 will flow through the packaged semiconductor device 140. For example, a pressure drop of about 30 kPa to 80 kPA may be desired in some applications. In embodiments wherein a conductive bump 126 height h (see FIG. 17) is about 100 µm, a semiconductor device width is about 13×13 mm, a required pressure drop is about 38 kPa at a fluid flow rate of about 45 mL/min, and a minimum of liquid flow area to the underfill material 132 area is determined to be about 35 to 65%, a minimum opening width $w_1$ and/or $w_2$ in some embodiments comprises about 4.5 mm, as an example.

Figure 18:
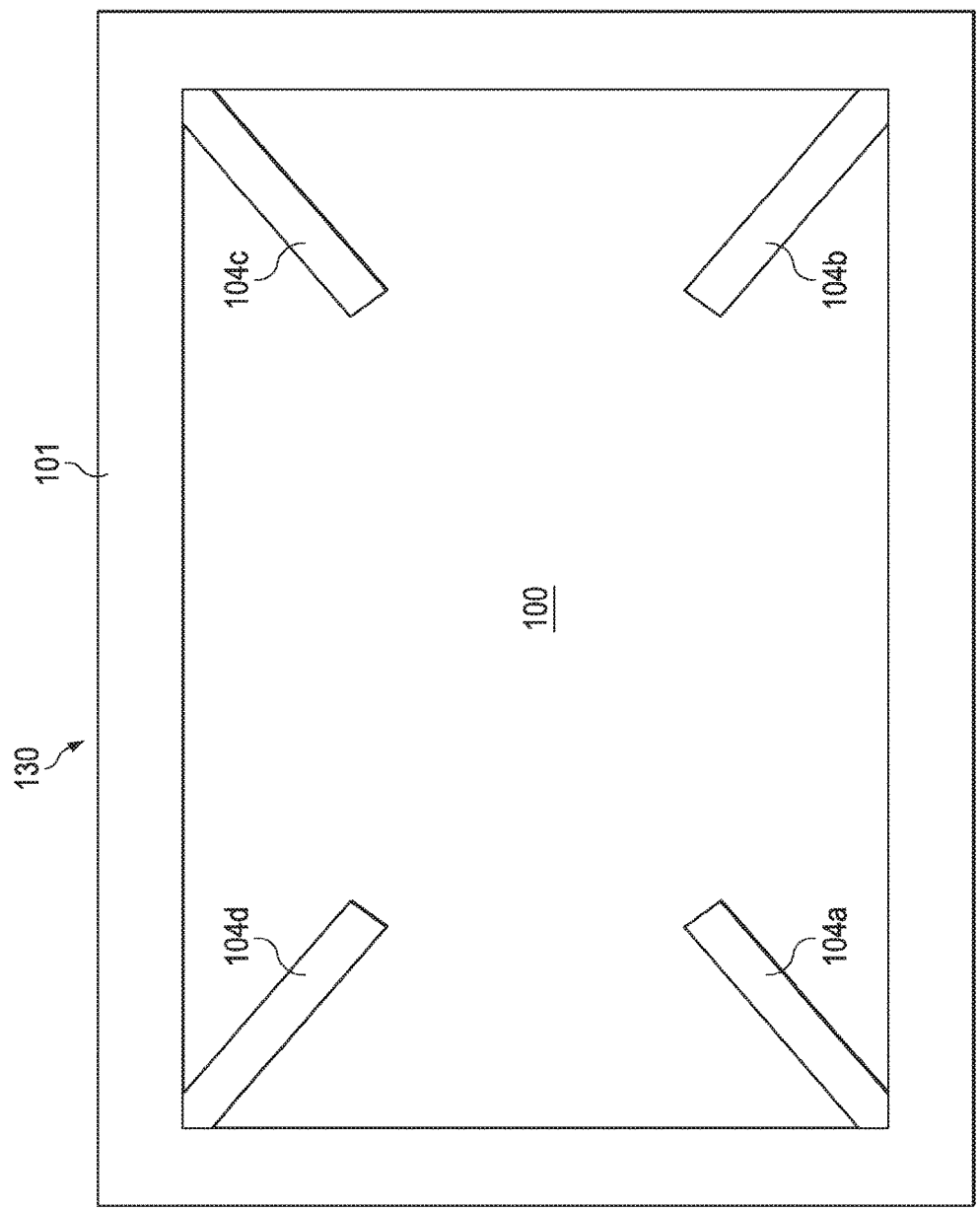
FIGS. 18 and 19 are top views and FIGS. 20 through 22 are cross-sectional views of a method of packaging a semiconductor device at various stages in accordance with some embodiments.
Figure 20:
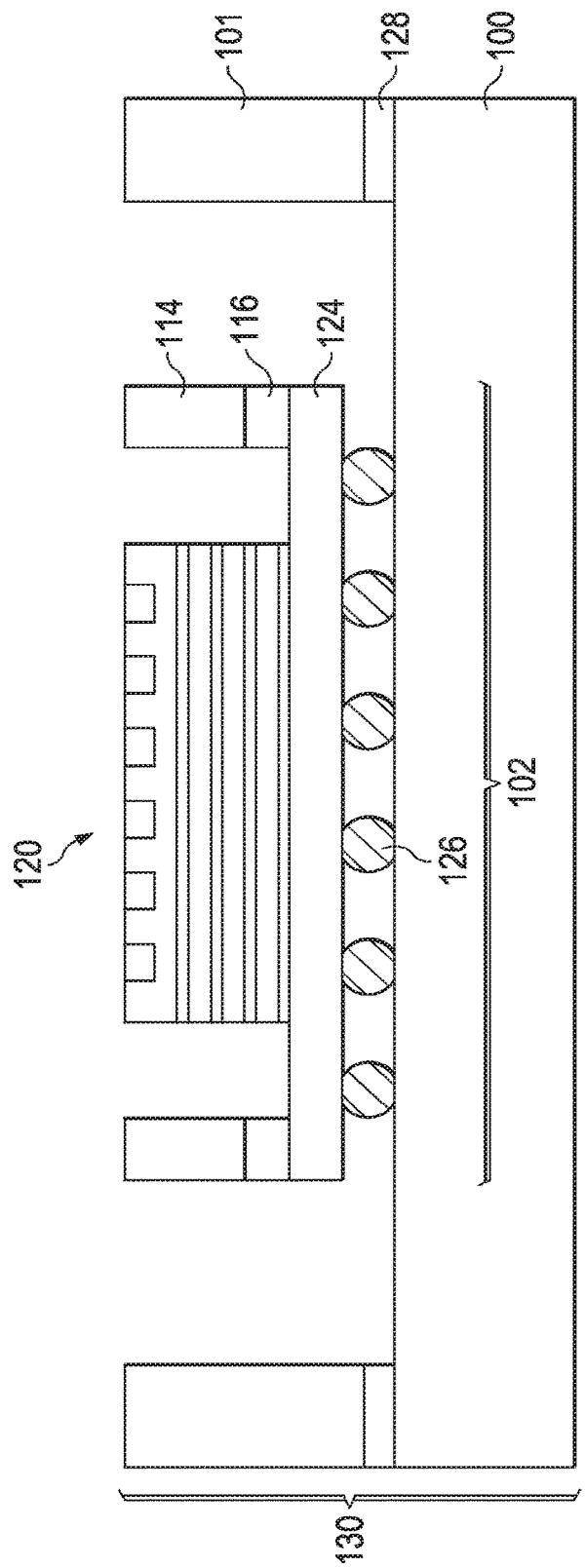
Figure 21:
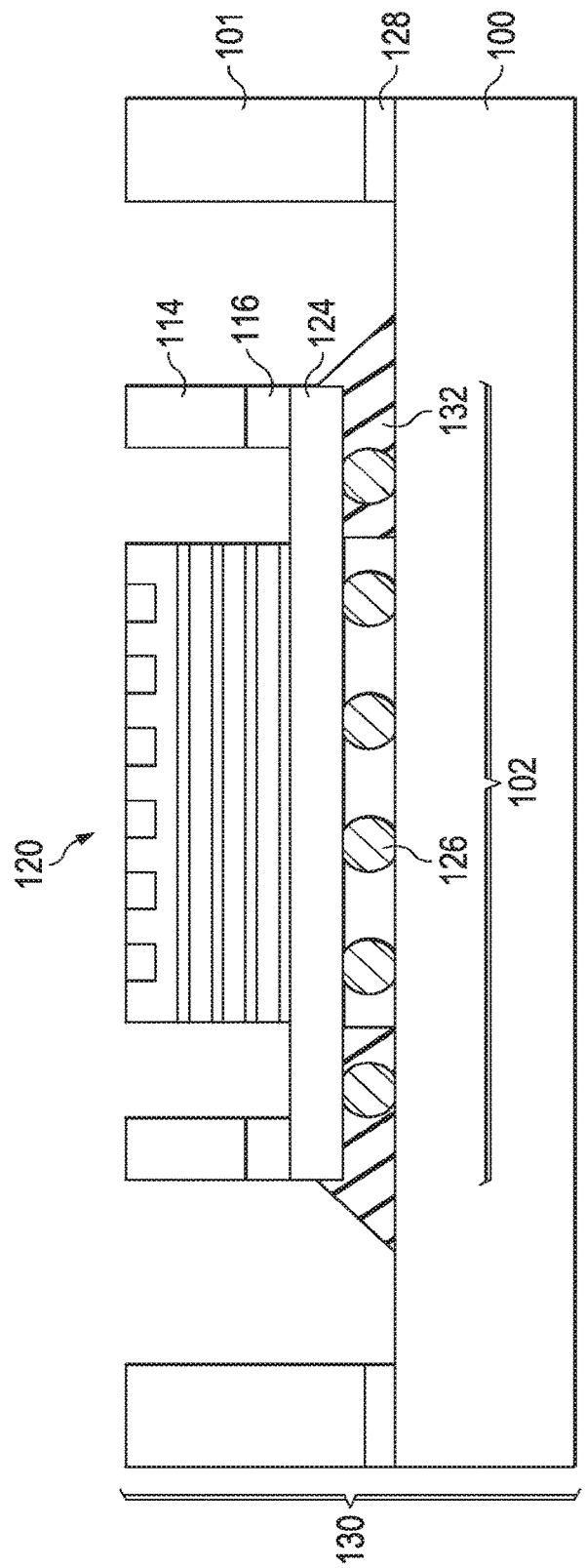
Figure 22:
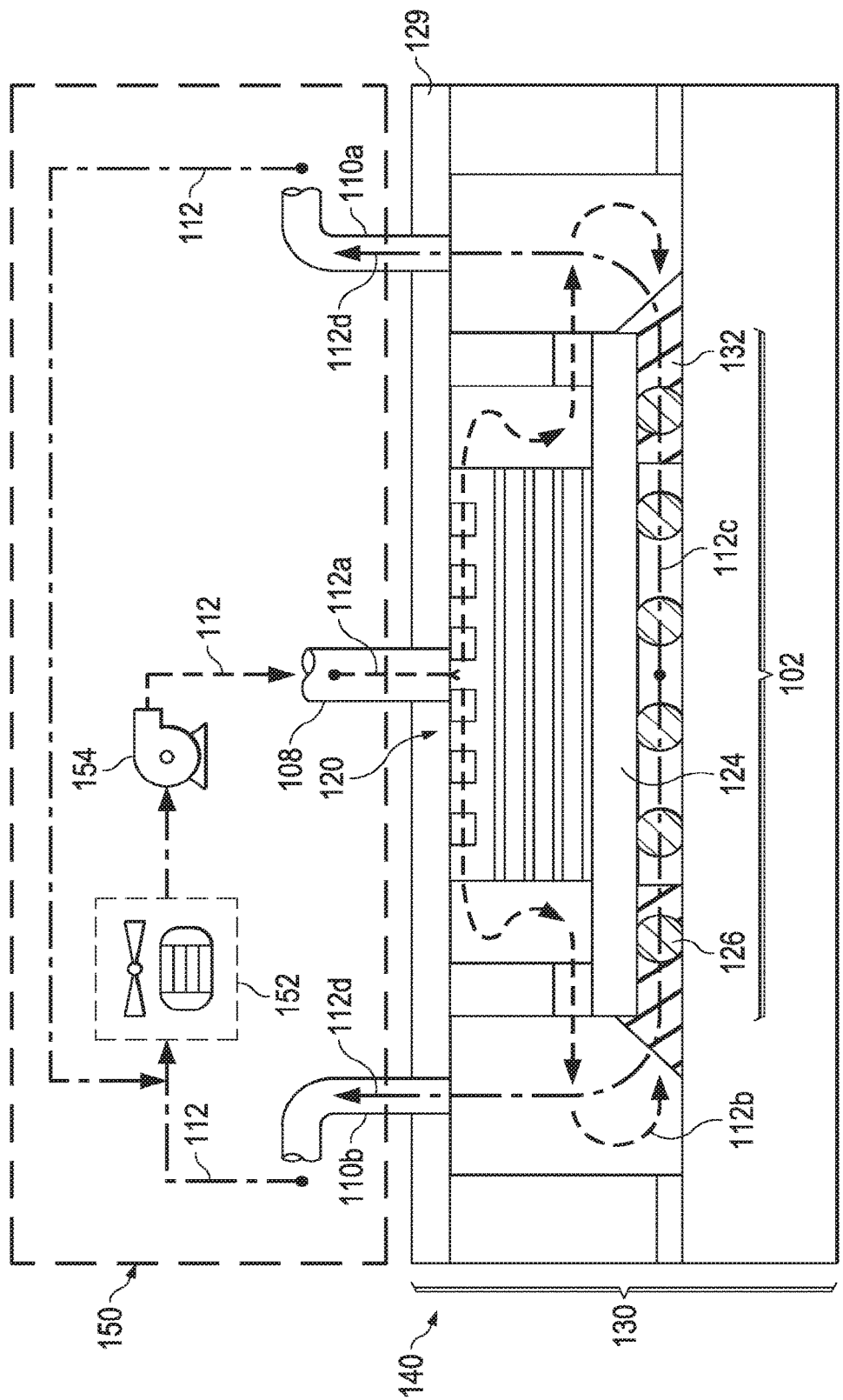

FIGS. 18 and 19 are top views and FIGS. 20 through 22 are cross-sectional views of a method of packaging a semiconductor device 120 at various stages in accordance with some embodiments. In FIG. 18, a packaging substrate 100 is provided, and outer ring member 101 and members 104a, 104b, 104c, and 104d are attached to the packaging substrate 100, e.g., using an adhesive (such as adhesive 128 shown in FIG. 11). In FIG. 19, an underfill material non-wettable treatment 142 is applied to a portion of the packaging substrate 100. The underfill material non-wettable treatment 142 may comprise applying a chemical such as a fluorocarbon polymer which inhibits underfill material 132 wetting and/or increases the surface roughness of the underfill material non-wettable treatment 142 region, thereby inhibiting the flow of underfill material 132, for example. The non-wettable treatment 142 may comprise a media blasting treatment such as $SiO_2$, glass beads, $Al_2O_3$, silicon carbide, or combinations thereof in some embodiments, for example. The underfill material non-wettable treatment 142 may also be formed by pre-fabrication of a sacrificial material, patterning the sacrificial material using a lithography process, and removing the sacrificial material by wet-etching after the underfill material 132 is dispensed and cured. Alternatively, the underfill material non-wettable treatment 142 may be applied using other methods, and may comprise other materials.

In FIG. 20, a partially packaged semiconductor device 120 is mounted onto the semiconductor device mounting region 102, e.g., using a chip-on-wafer-on-substrate (Co-WoS) mounting process or technique, in some applications. The inner ring member 114 is mounted onto the perimeter of the interposer substrate 124. The underfill material 132 is dispensed and cured, as shown in FIG. 21, and a cover 129 is attached, as shown in FIG. 22.

A pumping system 150 is coupled to the packaged semiconductor device 140, as shown in FIG. 22. For example, the pumping system 150 may include a heat exchanger 152 and a pump 154 adapted to pump a liquid (such as fluid 112 described herein). The pump 154 is coupled to the input port 108, and the heat exchanger 152 is coupled to the output ports 110a and 110b. The heat exchanger 152 of the pumping system 150 is coupled to the pump 154. During the operation of the packaged semiconductor device 140, fluid 112 is passed or flowed from the pump 154 to the input port 108, through the inner regions of the packaged semiconductor device 140 including between the fins 122, through the apertures 116 in the inner ring member 114, through partitions 106b and 106d, underneath the interposer substrate 124, through partitions 106a and 106c, and through the output ports 110a and 110b to the heat exchanger 152, which is adapted to cool the fluid 112. The fluid 112 is then passed from the heat exchanger 152 to the pump 154, and the process is continued to maintain a lowered temperature of the packaged semiconductor device 140.

Figure 23:
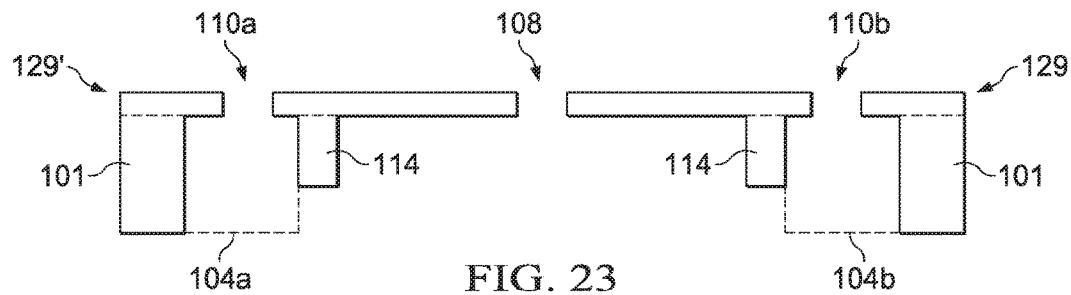
FIG. 23 is a cross-sectional view of a cover of a semiconductor device package in accordance with some embodiments.

FIG. 23 is a cross-sectional view of a cover 129' of a semiconductor device package 130 in accordance with some embodiments. The outer ring member 101 and/or the inner ring member 114 are integral to the cover 129' in the embodiment shown. The members 104a and 104b may also be integral to the cover 129' in some embodiments, as shown in phantom in FIG. 23 (e.g., in dashed lines). Likewise, the other members 104c and 104d may also be integral to the cover 129', not shown. In some embodiments, the plurality of members 104a, 104b, 104c, and/or 104d, the outer ring member 101, and/or the inner ring member 114 are integral to the cover 129'.

Figure 24:
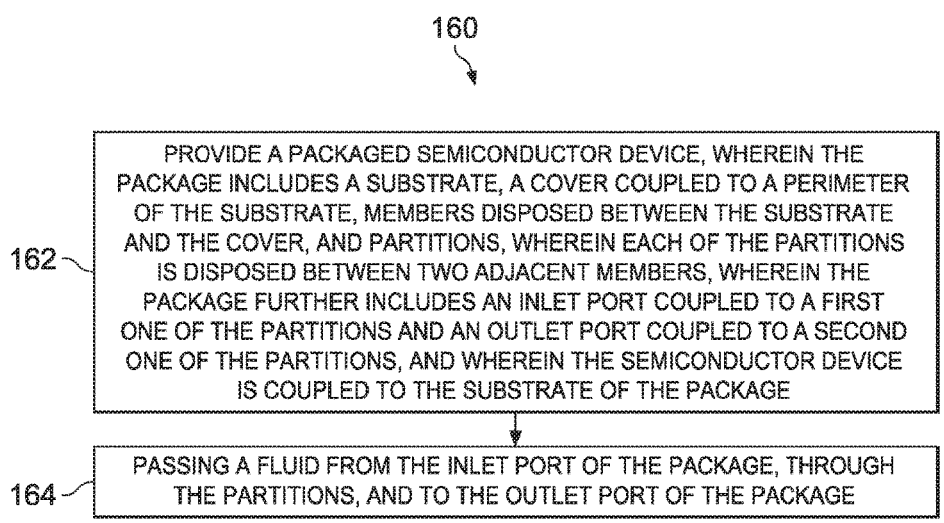
FIG. 24 is a flow chart of a method of cooling a packaged semiconductor device in accordance with some embodiments.

FIG. 24 is a flow chart 160 of a method of cooling a packaged semiconductor device 140 (see also FIGS. 3, 5, 11 and/or 22) in accordance with some embodiments. In step 162, a packaged semiconductor device 140 is provided. The package 130 includes a substrate 100, a cover 129 coupled to a perimeter of the substrate 100, a plurality of members 104a, 104b, 104c, and 104d disposed between the substrate 100 and the cover 129, and a plurality of partitions 106a, 106b, 106c, and 106d. Each of the plurality of partitions 106a, 106b, 106c, and 106d is disposed between two adjacent members 104a, 104b, 104c, and 104d of the plurality of members 104a, 104b, 104c, and 104d. The package 130 further includes an inlet port 108 coupled to the cover 129 and an outlet port 110a or 110b coupled to one of the plurality of partitions 106a or 106c. The semiconductor device 120 is coupled to the substrate 100 of the package 130. In step 164, a fluid 112 is passed from the inlet port 108 of the package 130, through the plurality of partitions 106a, 106b, 106c, and 106d, and to the outlet port 110a or 110b of the package 130.

Some embodiments of the present disclosure include methods of packaging semiconductor devices, and also include packaged semiconductor devices that have been packaged using the methods described herein. Some embodiments of the present disclosure also include packages for semiconductor devices, and methods of cooling packaged semiconductor devices that have been packaged using the novel packaging methods and packages described herein.

Advantages of some embodiments of the disclosure include providing novel packages 130 for semiconductor devices 120 that are cooled by a fluid 112. The packages 130 are compatible with three-dimensional integrated circuit (3DIC) packaging structures, processes, and die stack-up architectures. The liquid cooling capability of the novel packages 130 can be fully utilized into heat dissipation of TTS devices, enabling 3DIC multi-directional cooling. The novel packages 130 and packaging methods provide a low cost solution to cooling packaged semiconductor devices 140, and provide efficient thermal management advantages. Reduced warpage and stress result from the use of the novel packages 130. The packages 130 have built-in cooling channels through which the fluid 112 comprising a coolant can be flowed, which avoids a heat trap issue that can occur in vertically stacked dies, and which further avoids degradation of electrical performance of the packages 130. Cooling the packages 130 using the fluid 112 and internal channel structures of the packages 130 advantageously provides the ability to maintain semiconductor device 120 operation temperature at or below maximum allowable operational temperatures. Furthermore, the novel packaging methods, cooling methods, packages 130, and packaged semiconductor device 140 structures and designs are easily implementable in manufacturing and packaging process flows.

In accordance with some embodiments of the present disclosure, a package for a semiconductor device includes a substrate including a semiconductor device mounting region, a cover coupled to a perimeter of the substrate, and a plurality of members disposed between the substrate and the cover. The package includes a plurality of partitions, each of the plurality of partitions being disposed between two adjacent members of the plurality of members. The package includes a fluid inlet port coupled to the cover, and a fluid outlet port coupled to one of the plurality of partitions.

In accordance with other embodiments, a packaged semiconductor device includes a substrate including a semiconductor device mounting region, and a semiconductor device coupled to the semiconductor device mounting region of the substrate. An outer ring member is disposed around a perimeter of the substrate, and an inner ring member is disposed around a perimeter of the semiconductor device mounting region. A plurality of members is disposed on the substrate between the outer ring member and the inner ring member. A cover is coupled to the outer ring member, the inner ring member, the plurality of members, and a top surface of the semiconductor device. The packaged semiconductor device includes a plurality of partitions, each of the plurality of partitions being disposed between two adjacent members of the plurality of members, and each of the plurality of partitions being disposed between the outer ring member and the inner ring member. A fluid inlet port is coupled to the cover, and a fluid outlet port is coupled to one of the plurality of partitions.

In accordance with other embodiments, a method of cooling a packaged semiconductor device includes providing a package. The package includes a substrate, a cover coupled to a perimeter of the substrate, a plurality of members disposed between the substrate and the cover, and a plurality of partitions. Each of the plurality of partitions is disposed between two adjacent members of the plurality of members. The package further includes an inlet port coupled to the cover and an outlet port coupled to one of the plurality of partitions. The method includes coupling a semiconductor device to the substrate of the package. The method includes passing a fluid from the inlet port of the package, through the plurality of partitions, and to the outlet port of the package.

In some aspects, embodiments described herein provide for a method of cooling a packaged semiconductor device. The method includes providing a package, wherein the package includes a substrate, a cover coupled to a perimeter of the substrate, a plurality of members disposed between the substrate and the cover, and a plurality of outer partitions, wherein each of the plurality of outer partitions is disposed between two adjacent members of the plurality of members and extends between the substrate and the cover, wherein the package further includes an inlet port coupled to the cover and an outlet port coupled to one of the plurality of outer partitions and further includes a ring member that allows fluid flow between an inner partition that defines a device mounting region and a first one of the plurality of outer partitions and a second portion that prevents fluid flow between the inner partition and a second one of the plurality of outer partitions. The method further includes coupling a semiconductor device to the device mounting region of the substrate of the package, and passing a fluid from the inlet port of the package and over a top surface of the semiconductor device, through at least one of the plurality of outer partitions, under a bottom surface of the semiconductor device, and to the outlet port of the package.

In other aspects, embodiments described herein provide for a method of cooling a packaged semiconductor device that includes flowing a fluid through an inlet port into a package. The method further includes, causing the fluid to flow radially outward from the inlet port across a top surface of a semiconductor device mounted within an inner partition defined by an inner ring member, thence to flow through apertures in the inner partition into respective first outer partitions, the respective first outer partitions defined at least in part by the inner ring member, an outer ring member, and respective elongated members disposed between a substrate and a cover, thence to flow underneath the semiconductor device, thence to flow from underneath the semiconductor device to respective second outer partitions. The method also includes flowing the fluid from the respective second outer partitions through an outlet port.

In yet other aspects, embodiments described herein provide for a method comprising coupling a fluid source to a package and flowing fluid from the fluid source to an inlet port of the package. The method also includes flowing the fluid from the inlet port to an inner partition in which is mounted a semiconductor device and flowing the fluid across cooling fins on a top major surface of the semiconductor device, then flowing the fluid from the inner partition through an aperture to a first outer partition, then flowing the fluid across conductive bumps on a bottom major surface of the semiconductor device. The method continues with flowing the fluid into a second outer partition, and flowing the fluid from the second outer partition to an outlet port.

One general aspect of embodiments disclosed herein includes a package, including a substrate, a cover coupled to a perimeter of the substrate, an inner partition, and at least one outer partition defined between the substrate and the cover. The package further includes an inner ring member between the inner partition and the at least one outer partition, the inner ring member having a first aperture that allows fluid flow between the inner partition and the at least one outer partition. The package further includes an integrated circuit device mounted to the substrate within the inner partition; and an underfill material between the integrated circuit device and the substrate. The underfill material has therein fluid channels to allow fluid to flow there through between the integrated circuit device and the substrate.

Another general aspect of embodiments disclosed herein includes a package, including a substrate, a cover over the substrate, and an inner partition between the substrate and the cover. The package further includes a first outer partition between the substrate and the cover, and a second outer partition between the substrate and the cover, a first wall between the inner partition and the first outer partition, the first wall having therein an aperture to allow fluid flow between the inner partition and the first outer partition, and a second wall between the inner partition and the second outer partition, the second wall configured to prevent fluid flow between the inner partition and the second outer partition.

Yet another general aspect of embodiments disclosed herein includes a package, including a package substrate which includes a semiconductor device mounting region, and a cover over the package substrate. The package includes a semiconductor device coupled to the semiconductor device mounting region of the package substrate, and an outer ring member disposed around a perimeter of the package substrate, and an inner ring member mounted to a perimeter of the semiconductor device, the inner ring member defining an inner partition. The package further includes plurality of members extending between the package substrate and the cover, the plurality of members defining respective outer partitions, wherein the inner ring member is configured to allow fluid flow between the inner partition and one of the outer partitions and further configured to prevent fluid flow between the inner partition and a second one of the outer partitions. The package also includes a fluid inlet port coupled to the inner partition and a fluid outlet port coupled to the second one of the outer partitions.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package, comprising:
   a substrate;
   a cover coupled to a perimeter of the substrate;
   an inner partition and at least one outer partition defined between the substrate and the cover;
   an inner ring member between the inner partition and the at least one outer partition, the inner ring member having a first aperture that allows fluid flow between the inner partition and the at least one outer partition;
   an integrated circuit device mounted to the substrate within the inner partition; and
   an underfill material between the integrated circuit device and the substrate, the underfill material having therein fluid channels to allow fluid to flow there through between the integrated circuit device and the substrate.

2. The package according to claim 1, wherein the underfill material comprises an underfill material and the fluid channels define a fluid flow area and wherein a ratio between fluid flow area to underfill area is about 1:1.8.

3. The package according to claim 1, wherein a cross-sectional area of respective fluid channels is configured to produce a desired pressure drop of from about 30 kPa to about 80 kPa at a fluid flow rate of about 45 mL/min.

4. The package according to claim 1, wherein the fluid channels are defined by respective non-wettable areas on the substrate.

5. The package according to claim 1, wherein the underfill material is configured in a pattern selected from the group consisting of a peripheral pattern, a parallel strip pattern, and a corner pattern.

6. The package according to claim 1, wherein the integrated circuit device includes an integrated circuit die mounted to an interposer substrate and further wherein the inner ring member is mounted to the cover at an upper end and mounted to the interposer substrate at a lower end.

7. The package according to claim 1, wherein the at least one outer partition includes a plurality of outer partitions.

8. The package according to claim 7, wherein the inner ring member is configured to allow fluid flow between the inner partition and a first one of the plurality of outer partitions and further wherein the package is configured to allow fluid flow under the integrated circuit device from the first one of the plurality of outer partitions to a second one of the plurality of outer partitions.

9. The package according to claim 8, further comprising an outlet port in fluid flow communication with the second one of the plurality of outer partitions, the outlet port configured to allow a fluid to flow out of the package from the second one of the outer partitions.

10. The package according to claim 1, wherein the integrated circuit device includes a stack of dies mounted to an interposer.

11. The package according to claim 1, wherein the integrated circuit device includes a top surface having a plurality of fins therein and wherein the package is configured to allow fluid to flow amongst the plurality of fins.

12. A package, comprising:
    a substrate;
    a cover over the substrate;
    an inner partition between the substrate and the cover;
    a first outer partition between the substrate and the cover, and a second outer partition between the substrate and the cover;
    a first wall between the inner partition and the first outer partition, the first wall having therein an aperture to allow fluid flow between the inner partition and the first outer partition; and
    a second wall between the inner partition and the second outer partition, the second wall configured to prevent fluid flow between the inner partition and the second outer partition.

13. The package according to claim 12, further comprising an integrated circuit device within the inner partition and a fluid flow path extending from the first outer partition, under the integrated circuit device and into the second outer partition.

14. The package according to claim 13, wherein the integrated circuit device includes a plurality of connectors and wherein the fluid flow path surrounds respective ones of the plurality of connectors.

15. The package according to claim 13, further comprising:
    underfill material between the substrate and the integrated circuit device; and
    at least one fluid flow channel extending through the underfill material.

16. The package according to claim 15, wherein the underfill material has an underfill area and wherein the at least one fluid flow channel defines a fluid flow area and further wherein a ratio between fluid flow area to underfill area is about 1:1.8.

17. The package according to claim 15, wherein the underfill material comprises a parallel strip pattern, a tile pattern, a peripheral pattern or a corner pattern.

18. A package, comprising:
- a package substrate including a semiconductor device mounting region and a cover over the package substrate;
- a semiconductor device coupled to the semiconductor device mounting region of the package substrate;
- an outer ring member disposed around a perimeter of the package substrate;
- an inner ring member mounted to a perimeter of the semiconductor device, the inner ring member defining an inner partition;
- a plurality of members extending between the package substrate and the cover, the plurality of members defining respective outer partitions;
- the inner ring member being configured to allow fluid flow between the inner partition and one of the outer partitions and further configured to prevent fluid flow between the inner partition and a second one of the outer partitions;
- a fluid inlet port coupled to the inner partition; and
- a fluid outlet port coupled to the second one of the outer partitions.

19. The package according to claim 18, wherein the semiconductor device comprises one or more integrated circuit dies coupled to an interposer substrate, and further comprising a fluid flow path from a first one of the outer partitions, under the interposer substrate, and to a second one of the outer partitions.

20. The package of claim 19, wherein the fluid flow path extends through channels in an underfill material between the interposer substrate and the package substrate.

* * * * *